US012765053B2

(12) United States Patent
Liu et al.

(10) Patent No.: US 12,765,053 B2
(45) Date of Patent: Oct. 13, 2026

(54) THREE DIMENSIONAL INTEGRATED CIRCUIT AND FABRICATION THEREOF

(71) Applicants: TAIWAN SEMICONDUCTOR MANUFACTURING COMPANY, LTD., Hsinchu (TW); National Yang Ming Chiao Tung University, Hsinchu City (TW)

(72) Inventors: Yi-Chun Liu, Taichung City (TW); Chun-Yi Cheng, New Taipei City (TW); Chien-Te Tu, Hsinchu City (TW); Chee-Wee Liu, Taipei City (TW)

(73) Assignees: TAIWAN SEMICONDUCTOR MANUFACTURING COMPANY, LTD., Hsinchu (TW); NATIONAL YANG MING CHIAO TUNG UNIVERSITY, Hsinchu City (TW)

( * ) Notice: Subject to any disclaimer, the term of this patent is extended or adjusted under 35 U.S.C. 154(b) by 401 days.

(21) Appl. No.: 18/461,700

(22) Filed: Sep. 6, 2023

(65) Prior Publication Data

US 2025/0081604 A1    Mar. 6, 2025

(51) Int. Cl.

| | |
|---|---|
| ***H10D 84/00*** | (2025.01) |
| ***H10D 30/01*** | (2025.01) |
| ***H10D 30/43*** | (2025.01) |
| ***H10D 30/67*** | (2025.01) |
| ***H10D 62/10*** | (2025.01) |

(Continued)

(52) U.S. Cl.

CPC ......... *H10D 84/856* (2025.01); *H10D 30/014* (2025.01); *H10D 30/43* (2025.01); *H10D 30/6735* (2025.01); *H10D 62/121* (2025.01); *H10D 64/017* (2025.01); *H10D 84/0167* (2025.01); *H10D 84/017* (2025.01); *H10D 84/0186* (2025.01); *H10D 84/038* (2025.01); *H10D 88/01* (2025.01);

(Continued)

(58) Field of Classification Search

CPC .... H10D 84/856; H10D 84/85; H10D 84/851; H10D 84/8311; H10D 88/00; H10D 88/01

See application file for complete search history.

(56) References Cited

U.S. PATENT DOCUMENTS

| | | | | |
|---|---|---|---|---|
| 2017/0194151 A1* | 7/2017 | Zhang | ............... | H01L 21/02422 |
| 2020/0212038 A1* | 7/2020 | Rachmady | ......... | H10D 84/0167 |

(Continued)

OTHER PUBLICATIONS

Ahmed et al., "Characterization of Low-Dielectric Constant Silicon Carbonitride (SICN) Dielectric Films for Charge Trapping Non-volatile Memories", ECS Transactions, 2015, vol. 69, No. 3, pp. 99-109.

(Continued)

*Primary Examiner* — Reema Patel

(74) *Attorney, Agent, or Firm* — Birch, Stewart, Kolasch & Birch, LLP

(57) ABSTRACT

A method includes following steps. A first transistor is formed on a substrate. A first dielectric layer is formed over the first transistor. A first trench is formed in the first dielectric layer. An amorphous semiconductor layer is deposited in the first trench and over the first dielectric layer. The amorphous semiconductor layer is crystallized into a crystalline semiconductor layer. A second transistor is formed over the crystalline semiconductor layer.

20 Claims, 46 Drawing Sheets

(51) Int. Cl.
*H10D 64/01* (2025.01)
*H10D 84/01* (2025.01)
*H10D 84/03* (2025.01)
*H10D 84/85* (2025.01)
*H10D 88/00* (2025.01)
*H10W 20/00* (2026.01)

(52) U.S. Cl.
CPC ....... *H10W 20/062* (2026.01); *H10W 20/064* (2026.01); *H10W 20/0698* (2026.01); *H10W 20/083* (2026.01)

(56) References Cited

U.S. PATENT DOCUMENTS

| | | | | |
|---|---|---|---|---|
| 2021/0202475 | A1* | 7/2021 | Hu | H10D 88/00 |
| 2022/0384433 | A1* | 12/2022 | Ishizu | H10D 84/856 |

OTHER PUBLICATIONS

Alarcón-Flores et al., "Low interface states and high dielectric constant $Y_2O_3$ films on Si substrates", Journal of Vacuum Science & Technology B, 2006, vol. 24, No. 4, pp. 1873-1877.

Azadmanjiri et al., "A review on hybrid nanolaminate materials synthesized by deposition techniques for energy storage applications", Journal of Materials Chemistry A., 2014, vol. 2, pp. 3695-3708.

Hayashi et al., "Film Thickness Dependence of Dielectric Properties of $BaTiO_3$ Thin Films Prepared by Sol-Gel Method", Japanese Journal of Applied Physics, 1994, vol. 33, pp. 5277-5280.

Jung et al., "A 500-MHz DDR High-Performance 72-Mb 3-D SRAM Fabricated With Laser-Induced Epitaxial c-Si Growth Technology for a Stand-Alone and Embedded Memory Application", IEEE Transactions on Electron Devices, Feb. 2010, vol. 57, No. 2, pp. 474-481.

Lenka et al., "AlGaN/GaN-based HEMT on SiC substrate for microwave characteristics using different passivation layers", Pramana journal of physics, Jul. 2012, vol. 79, No. 1, pp. 151-163.

Ni et al., "Equivalent Oxide Thickness (EOT) Scaling With Hafnium Zirconium Oxide High-K Dielectric Near Morphotropic Phase Boundary", 2019 IEEE International Electron Devices Meeting (IEDM), 2019, pp. 7.4.1-7.4.4.

Rachmady et al., "300mm Heterogeneous 3D Integration of Record Performance Layer Transfer Germanium PMOS with Silicon NMOS for Low Power High Performance Logic Applications", 2019 IEEE International Electron Devices Meeting (IEDM), 2019, pp. 29.7.1-29.7.4.

Ramana et al., "Nanocrystalline $Pb(Zr_{0.52}Ti_{0.48})O_3$ Ferroelectric Ceramics: Mechanical and Electrical Properties", Journal of Nanomaterials, 2010, vol. 2010, pp. 1-8.

Subramanian et al., "First Monolithic Integration of 3D Complementary FET (CFET) on 300mm Wafers", 2020 IEEE Symposium on VLSI Technology, 2020, pp. 1-2.

* cited by examiner

THREE DIMENSIONAL INTEGRATED CIRCUIT AND FABRICATION THEREOF

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
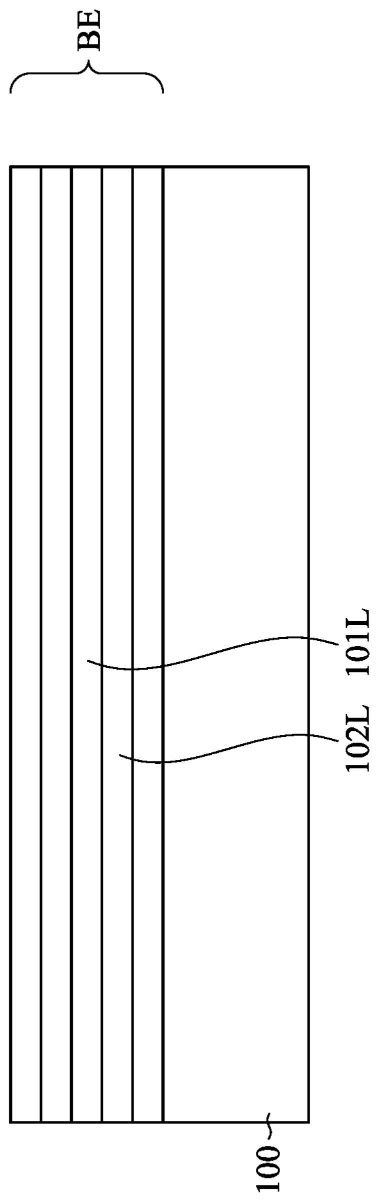
FIGS. 1-22B illustrate cross-sectional views and top views of intermediate stages of a method of forming a 3D IC structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated circuit (IC) devices integration improvements are essentially two-dimensional (2D) in nature, in that the volume occupied by the integrated components is essentially on the surface of the semiconductor wafer. Although dramatic improvement in lithography has resulted in considerable improvement in 2D IC formation, there are physical limits to the density that can be achieved in two dimensions. One of these limits is the minimum size needed to make these components. Also, when more devices are put into one chip, more complex designs are used.

In light of these challenges, the present disclosure, across various embodiments, introduces a three-dimensional (3D) IC structure. This structure comprises lower transistors at a substrate level and higher transistors at an elevated level, resulting in a notable increase in device density within a specified area. More specifically, several embodiments of the current disclosure utilize a laser-liquid-phase-epitaxy technique to create an epitaxial layer above the lower transistors. This epitaxial layer functions as a seed layer, enabling the growth of semiconductor layers for the fabrication of the higher transistors on the elevated level. Thus, the 3D IC structure can be fabricated without using a wafer bonding technique.

FIGS. 1-22B illustrate cross-sectional views and top views of intermediate stages of a method of forming a 3D IC structure in accordance with some embodiments. Although the cross-sectional views shown in FIGS. 1-22B are described with reference to a method, it will be appreciated that the structures shown in FIGS. 1-22B are not limited to the method but rather may stand alone separate of the method. Although FIGS. 1-22B are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

FIG. 1 is a cross-sectional view of an intermediate stage in forming a 3D IC structure. In FIG. 1, a semiconductor substrate 100 is illustrated. In some embodiments, the substrate 100 may be a semiconductor substrate, such as a bulk semiconductor substrate, a semiconductor-on-insulator (SOI) substrate, a multi-layered or gradient substrate, or the like. The substrate 100 may include a semiconductor material, such as an elemental semiconductor including Si and Ge; a compound or alloy semiconductor including SiC, SiGe, GeSn, GaAs, GaP, GaAsP, AlInAs, AlGaAs, GaInAs, InAs, GaInP, InP, InSb, GaInAsP; a combination thereof, or the like. The substrate 100 may be doped or substantially un-doped. In a specific example, the substrate 100 is a bulk silicon substrate, which may be a wafer.

FIG. 1 also illustrates a bottom epitaxial stack BE formed over the semiconductor substrate 100. The bottom epitaxial stack BE is a multi-layer stack comprising one or more first semiconductor layers 101L alternating with one or more second semiconductor layers 102L. For purposes of illustration and as discussed in greater detail below, the first semiconductor layers 101L serve as sacrificial layers that will be removed and the second semiconductor layers 102L serve as channel layers that will be patterned to form channel regions of bottom GAA-FETs.

The bottom epitaxial stack BE is illustrated as including three first semiconductor layers 102L and two second semiconductor layers 102L for illustrative purposes. In some embodiments, the bottom epitaxial stack BE may include any number of the first semiconductor layers 101L and the second semiconductor layers 102L. Each of the layers of the bottom epitaxial stack BE may be epitaxially grown using a process such as chemical vapor deposition (CVD), atomic layer deposition (ALD), vapor phase epitaxy (VPE), molecular beam epitaxy (MBE), or the like.

The first semiconductor layers 101L and the second semiconductor layers 102L may be materials having a high-etch selectivity to one another. As such, the first semiconductor layers 101L of a first semiconductor material may be removed without significantly removing the second semiconductor layers 102L of a second semiconductor material, thereby allowing the second semiconductor layers 102L to serve as channel regions of bottom GAA-FETs. In various embodiments, the first semiconductor layers 101L and the second semiconductor layers 102L are made of different materials selected from the group consisting of Si, Ge, Sn, $Si_{1-x}Ge_x$, $Ge_{1-y}Sn_y$, $Si_{1-x-y}Ge_xSn_y$, III-V compound, and combinations thereof. Because of the material difference, in subsequent processing, the first semiconductor layers 101L can be selectively etched without substantially etching the second semiconductor layers 102L.

Figure 2:
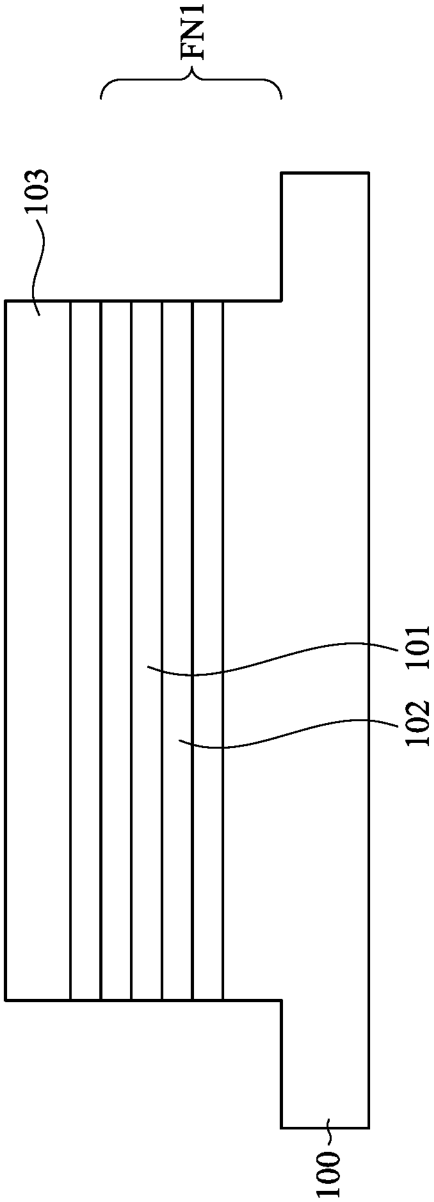

Referring now to FIG. 2, a fin structure FN1 is formed by etching trenches in the bottom epitaxial stack BE and the substrate 100. The etching may be any acceptable etch process, such as a reactive ion etch (RIE), neutral beam etch (NBE), the like, or a combination thereof. The etching may be anisotropic. Forming the fin structure FN1 by etching the epitaxial stack BE may further define first nanostructures 101 from the first semiconductor layers 101L and define second nanostructures 102 from the second semiconductor layers 102L.

The fin structure FN1 may be patterned by any suitable method. For example, a hard mask 103 (e.g., formed of $SiO_2$) is first formed over the bottom epitaxial stack BE by using suitable deposition and patterning techniques, followed by patterning the bottom epitaxial stack BE into the fin structure FN1 by one or more etching processes using the hard mask 103 as an etch mask. While each of the fin structure FN1 is illustrated as having a consistent width throughout, in other embodiments, the fin structures FN1 may have tapered sidewalls such that a width of the fin structure FN1 continuously increases in a direction towards the substrate 100. In such embodiments, each of the nanostructures 101, 102 may have a different width and be trapezoidal in shape.

Figure 3:
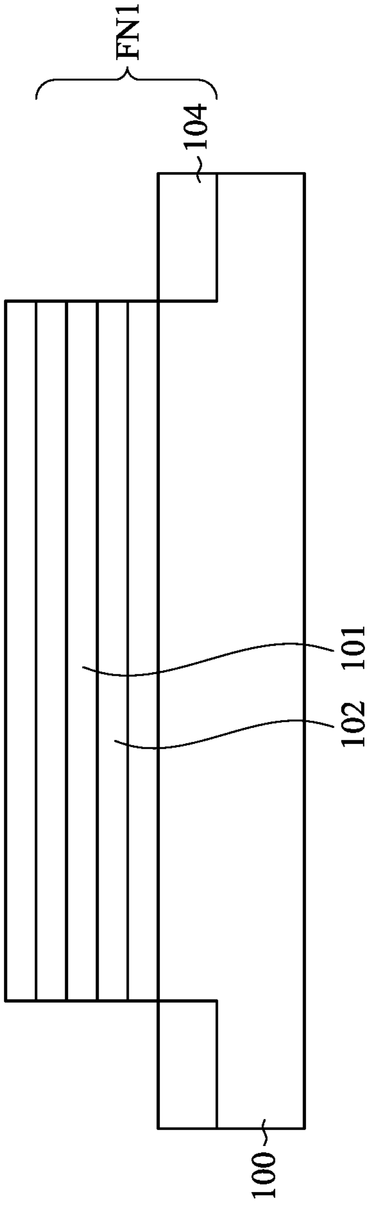

In FIG. 3, shallow trench isolation (STI) regions 104 are formed adjacent the fin structure FN1. The STI regions 104 may be formed by depositing an insulation material over the substrate 100 and the fin structure FN1, and between adjacent fin structures FN1. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiments, the insulation material is silicon oxide formed by an FCVD process. An anneal process may be performed once the insulation material is formed. In an embodiment, the insulation material is formed such that excess insulation material covers the nanostructures 101, 102. Although the insulation material is illustrated as a single layer, some embodiments may utilize multiple layers. For example, in some embodiments a liner (not separately illustrated) may first be formed along a surface of the substrate 100, the fin structure FN1. Thereafter, a fill material, such as those discussed above may be formed over the liner.

A removal process is then applied to the insulation material to remove excess insulation material over the nanostructures 101, 102. In some embodiments, a planarization process such as a chemical mechanical polish (CMP), an etch-back process, combinations thereof, or the like may be utilized. The planarization process is performed until a topmost one of the first nanostructures 101 such that a top surface of the topmost one of the first nanostructures 101 and the insulation material are level after the planarization process is complete. In this way, the hard mask 103 can be removed by the planarization process.

The insulation material is then recessed to form the STI regions 104. The insulation material is recessed such that an upper portion of the fin structure FN1 protrudes from between neighboring STI regions 104. Further, the top surfaces of the STI regions 104 may have a flat surface as illustrated, a convex surface, a concave surface (such as dishing), or a combination thereof. The top surfaces of the STI regions 104 may be formed flat, convex, and/or concave by an appropriate etch. The STI regions 104 may be recessed using an acceptable etching process, such as one that is selective to the material of the insulation material (e.g., etches the material of the insulation material at a faster rate than the material of the fin structure FN1. For example, an oxide removal using, for example, dilute hydrofluoric (dHF) acid may be used.

The process described above with respect to FIGS. 1 through 3 is just one example of how the fin structure FN1 may be formed. In some embodiments, the fin structure FN1 may be formed using a mask and an epitaxial growth process. For example, a dielectric layer can be formed over a top surface of the substrate 100, and trenches can be etched through the dielectric layer to expose the underlying substrate 100. Epitaxial structures can be epitaxially grown in the trenches, and the dielectric layer can be recessed such that the epitaxial structures protrude from the dielectric layer to form the fin structure FN1. The epitaxial structures may comprise the alternating semiconductor materials discussed above, such as the first semiconductor materials of the first semiconductor layers 101L and the second semiconductor materials of the second semiconductor layers 102L. In some embodiments where epitaxial structures are epitaxially grown, the epitaxially grown materials may be in situ doped during growth, which may obviate prior and/or subsequent implantations, although in situ and implantation doping may be used together.

Figure 4:
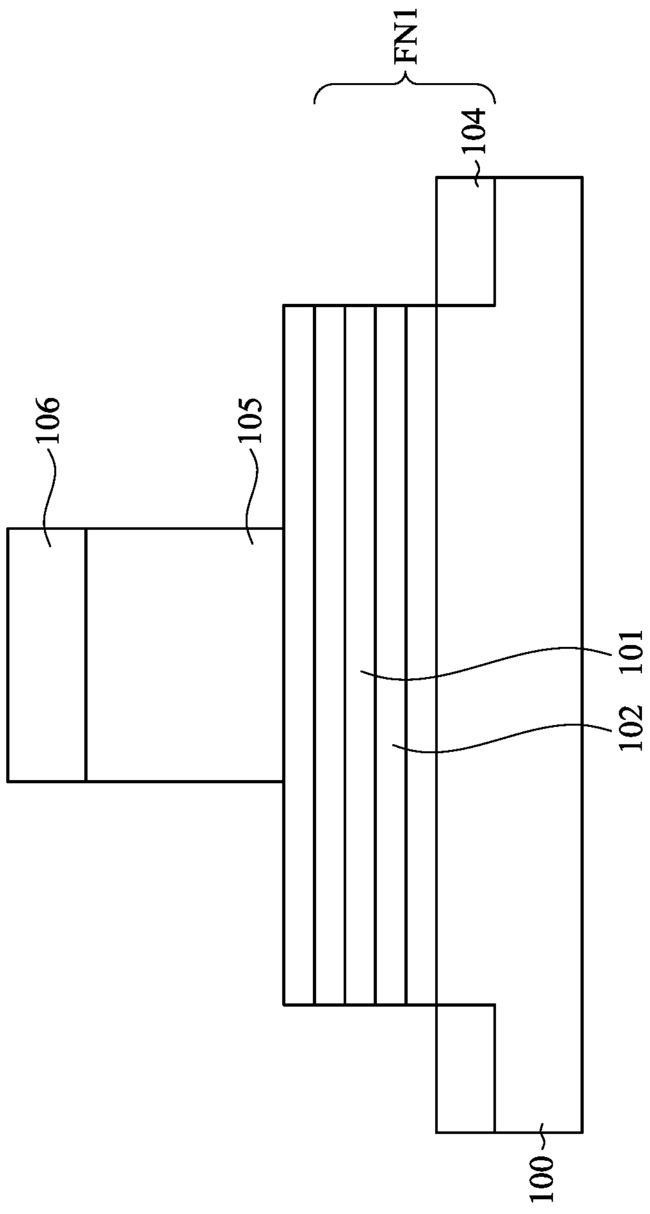

In FIG. 4, a dummy gate structure 105 is formed across the fin structure FN1. The dummy gate structure 105 may include a dummy dielectric layer, for example, silicon oxide, silicon nitride, a combination thereof, or the like, and may be deposited or thermally grown according to acceptable techniques. The dummy gate structure 105 further includes a dummy gate layer formed over the dummy dielectric layer. The dummy gate layer may be deposited over the dummy dielectric layer and then planarized, such as by a CMP. A hard mask layer 106 (e.g., formed of $SiO_2$) may be deposited over the dummy gate layer. The dummy gate layer may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer may be deposited by physical vapor deposition (PVD), CVD, sputter deposition, or other techniques for depositing the selected material. The dummy gate layer may be made of other materials that have a high etching selectivity from the etching of isolation regions. The mask layer 106 may include, for example, silicon nitride, silicon oxynitride, or the like.

The mask layer 106 may be patterned using acceptable photolithography and etching techniques. The pattern of the mask layer 106 then may be transferred to the dummy gate layer and to the dummy dielectric layer to form the dummy gate structure 105. The dummy gate structure 105 covers respective the channel region of the fin structure FN1. The dummy gate structure 105 may also have a lengthwise direction substantially perpendicular to the lengthwise direction of the fin structures FN1.

Figure 5:
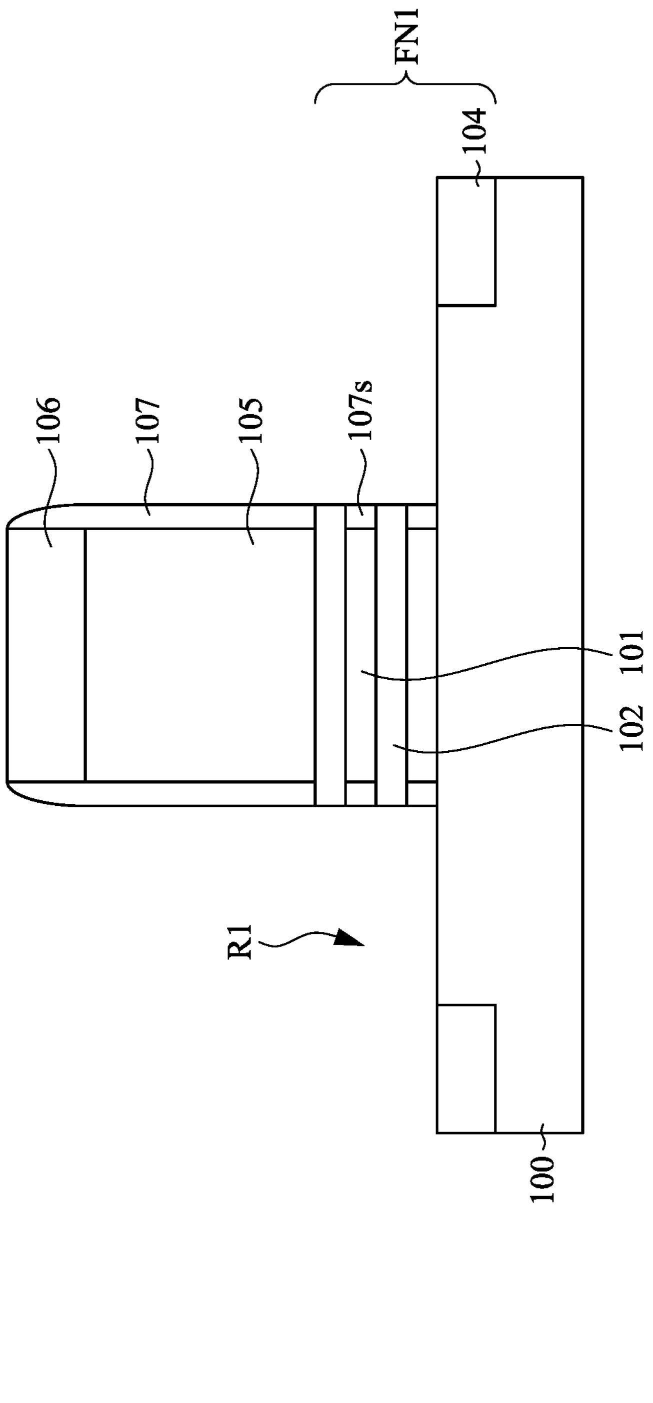

In FIG. 5, gate spacers 107 are formed on sidewalls of the dummy gate structure 105 and the hard mask layer 106. In some embodiments of the spacer formation step, a spacer material layer is deposited on the substrate 100. The spacer material layer may be a conformal layer that is subsequently etched back to form gate sidewall spacers. In the illustrated embodiment, a spacer material layer is disposed conformally on top and sidewalls of the dummy gate structure 105. The spacer material layer may include a dielectric material such as silicon oxide, silicon nitride, silicon carbide, silicon oxynitride, SiCN films, silicon oxycarbide, SiOCN films, and/or combinations thereof. The spacer material layer may be formed by depositing a dielectric material over the dummy gate structure 105 using processes such as, CVD process, a subatmospheric CVD (SACVD) process, a flowable CVD process, an ALD process, a PVD process, or other suitable process. An anisotropic etching process is then performed on the deposited spacer material layer to expose portions of the fin structure FN1 not covered by the dummy gate structure 105. Portions of the spacer material layer directly above the dummy gate structure 105 may be completely removed by this anisotropic etching process. Portions of the spacer material layer on sidewalls of the dummy gate structure 105 may remain, forming gate sidewall spacers, which are denoted as the gate spacers 107, for the sake of simplicity.

Next, exposed portions of the fin structure FN1 that laterally extend beyond the hard mask layer 106 and the gate spacers 107 are etched to form source/drain recesses R1 at opposite sides of the dummy gate structure 105, by using the hard mask layer 106 and the gate spacers 107 as an etch mask. Thereafter, portions of sidewalls of the layers in the fin structure FN1 formed of the first semiconductor materials (e.g., the first nanostructures 101) exposed by the source/drain recesses R1 are etched to form sidewall recesses between corresponding second nanostructures 102, followed by forming inner spacers 107*s* in the sidewall recesses. The resulting structure is illustrated in FIG. 5. The inner spacers 107*s* act as isolation features between subsequently formed source/drain regions and gate structure. As will be discussed in greater detail below, source/drain regions will be formed in the source/drain recesses R1, and the first nanostructures 101 will be replaced with a final gate structure.

The inner spacers 107*s* may be formed by, for example, depositing an inner spacer material layer in the sidewall recesses by using a conformal deposition process, such as CVD, ALD, or the like, followed by anisotropically etching the inner spacer layer to remove excessive inner spacer materials outside the sidewall recesses, while leaving the remaining inner spacer materials in the sidewall recesses to serve as the inner spacers 107*s*. The inner spacers 107*s* may comprise a material such as silicon nitride or silicon oxynitride, although any suitable material, such as low-dielectric constant (low-k) materials having a k-value less than about 3.5, may be utilized. Although outer sidewalls of the inner spacers 107*s* are illustrated as being flush with sidewalls of the second nanostructures 102, the outer sidewalls of the inner spacers 107*s* may extend beyond or be recessed from sidewalls of the second nanostructures 102.

Figure 6:
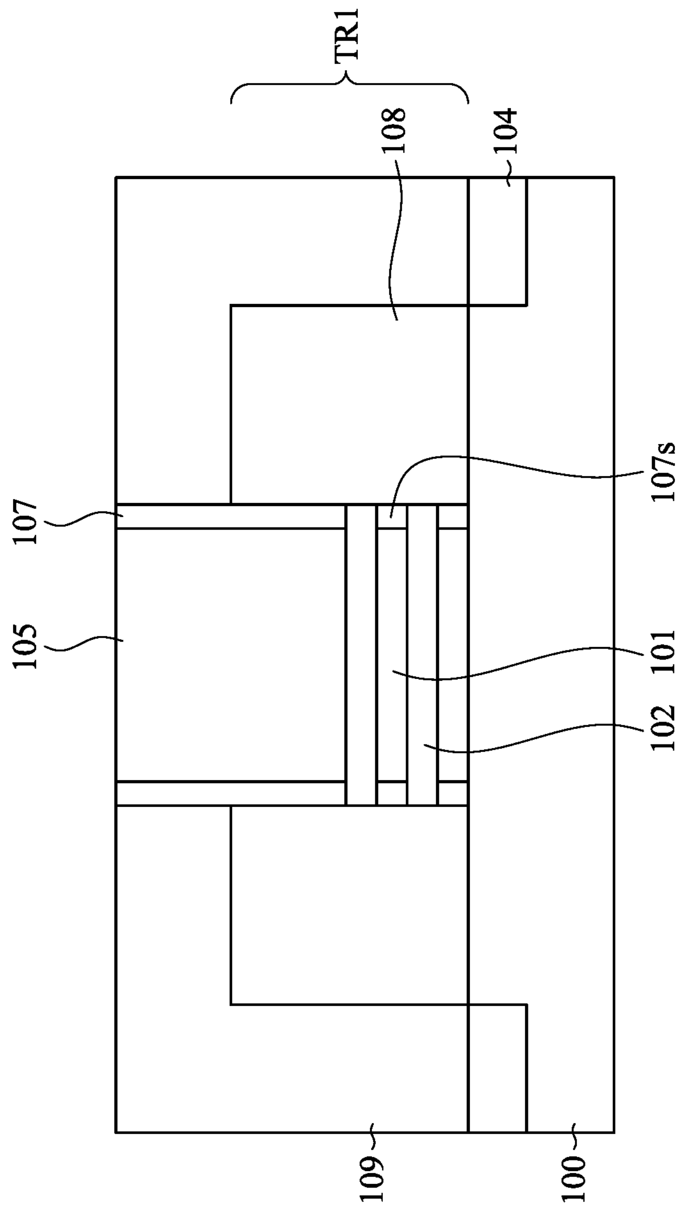

In FIG. 6, epitaxial source/drain regions 108 are formed in the source/drain recesses. In some embodiments, the source/drain regions 108 may exert stress on the second nanostructures 102, thereby improving device performance. As illustrated in FIG. 6, the epitaxial source/drain regions 108 are formed in the source/drain recesses such that the dummy gate structure 105 is disposed between respective neighboring pairs of the epitaxial source/drain regions 108. In some embodiments, the gate spacers 107 are used to separate the epitaxial source/drain regions 108 from the dummy gate structure 105, and the inner spacers 107*s* are used to separate the epitaxial source/drain regions 108 from the first nanostructures 101 by an appropriate lateral distance so that the epitaxial source/drain regions 108 do not short out with subsequently formed gates of the resulting bottom GAA-FET.

In some embodiments, the epitaxial source/drain regions 108 may include any acceptable material appropriate for n-type GAA-FETs. For example, if the second nanostructures 102 are silicon, the epitaxial source/drain regions 108 may include materials exerting a tensile strain on the second nanostructures 102, such as silicon carbide, phosphorous doped silicon carbide, silicon phosphide, or the like. In some embodiments, the epitaxial source/drain regions 108 may include any acceptable material appropriate for p-type GAA-FETs. For example, if the second nanostructures 102 are silicon, the epitaxial source/drain regions 108 may comprise materials exerting a compressive strain on the second nanostructures 102, such as silicon germanium, boron doped silicon germanium, germanium, germanium tin, or the like. The epitaxial source/drain regions 108 may be implanted with an n-type dopant (e.g., phosphorus) to form n-type source/drain regions or a p-type dopant (e.g., boron) to form p-type source/drain regions, followed by an anneal. In some embodiments, the epitaxial source/drain regions 108 may be in situ doped during growth.

After forming the epitaxial source/drain regions 108, an interlayer dielectric (ILD) layer 109 is formed over the dummy gate structure 105 by using suitable deposition techniques, followed by performing a planarization process (e.g., CMP) on the ILD layer 109 until the dummy gate structure 105 is exposed. The patterned mask 106 is thus removed by the planarization process. In some embodiments, the ILD layer 109 may be deposited by any suitable method, such as CVD, plasma-enhanced CVD (PECVD), or FCVD. Dielectric material(s) of the ILD layer 109 may include phospho-silicate glass (PSG), boro-silicate glass (BSG), boron-doped phospho-silicate glass (BPSG), undoped silicate glass (USG), or the like. Other insulation materials formed by any acceptable process may be used. Then, a planarization process, such as a CMP, may be performed to level the top surface of the ILD layer 109 with the top surface of the dummy gate structure 105.

Figure 7:
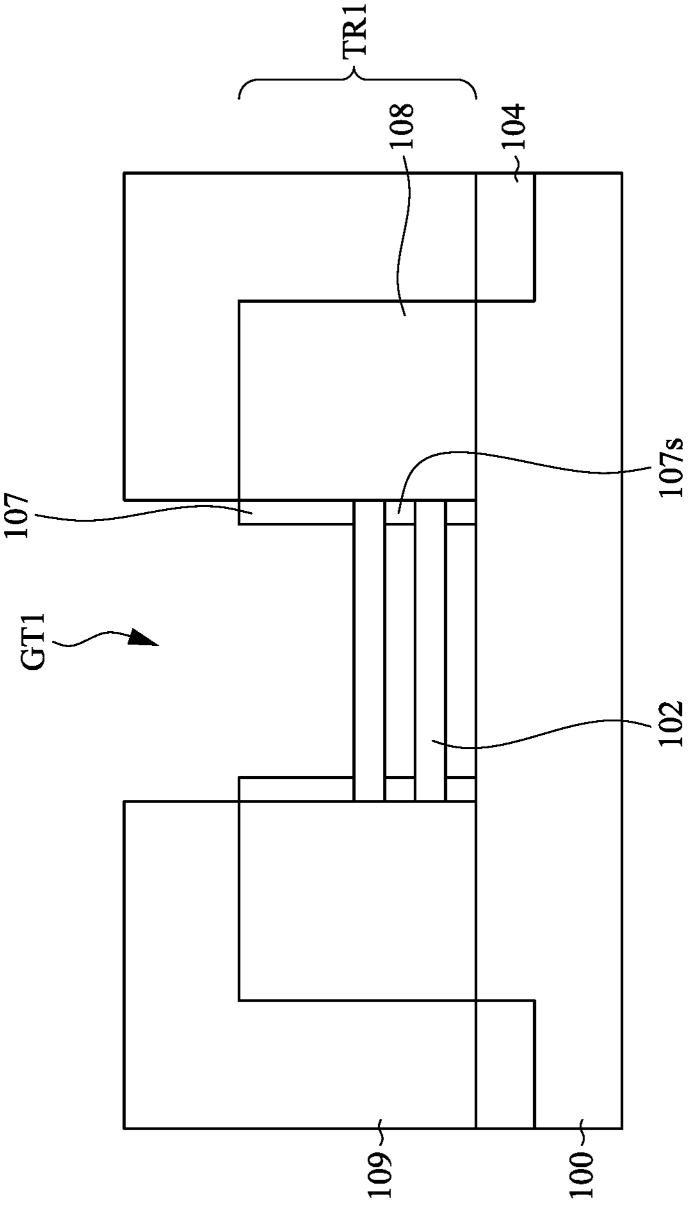

In FIG. 7, the dummy gate structure 105 is removed in one or more etching steps, so that a gate trench GT1 is formed between corresponding gate spacers 107. In some embodiments, the dummy gate structure 105 is removed by an anisotropic dry etch process. For example, the etching process may include a dry etch process using reaction gas(es) that selectively etch the dummy gate structure 105 at a faster etch rate than etching the gate spacers 107. In some embodiments, upper portions of the gate spacers 107 are also removed in the etching process of removing the dummy gate structure 105, such that remaining portions of the gate spacers 107 have top ends lower than the top surface of the ILD layer 109.

Next, the first nanostructures 101 in the gate trench GT1 are removed by an isotropic etching process such as wet etching or the like using etchants which are selective to the materials of the first nanostructures 101. Stated differently, the first nanostructures 101 are removed by using a selective etching process that etches the first nanostructures 101 at a faster etch rate than it etches the second nanostructures 102, thus forming spaces between the second nanostructures 102 (also referred to as sheet-to-sheet spaces if the nanostructures 102 are nanosheets). This step can be referred to as a channel release process. At this interim processing step, the spaces between second nanostructures 102 may be filled with ambient environment conditions (e.g., air, nitrogen, etc). In some embodiments, the second nanostructures 102 can be referred to as nanosheets, nanowires, nanoslabs, nanorings having nano-scale size (e.g., a few nanometers), depending on their geometry. For example, in some embodiments the second nanostructures 102 may be trimmed to have a substantial rounded shape (i.e., cylindrical) due to the selective etching process for completely removing the first nanostructures 101. In that case, the resultant second nanostructures 102 can be called nanowires. In embodiments in which the first nanostructures 101 include, e.g., SiGe, and the second nanostructures 102 include, e.g., Si or SiC, tetramethylammonium hydroxide (TMAH), ammonium hydroxide ($NH_4OH$) or the like may be used to remove the first nanostructures 101. In some embodiments, the second nanostructures 102 (also referred to as nanosheets) each have a thickness in a range from about 0.1 nm to about 100 nm, and a width in a range from about 0.1 nm to about 100 nm. In some embodiments, the cross-section profile of the second nanostructures 102 can be rectangular, square, circular, diamond, etc., with or without rounded corners.

Figure 8B:
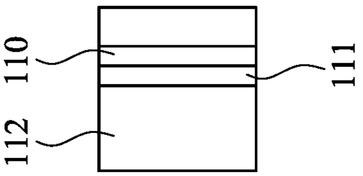
Figure 8A:
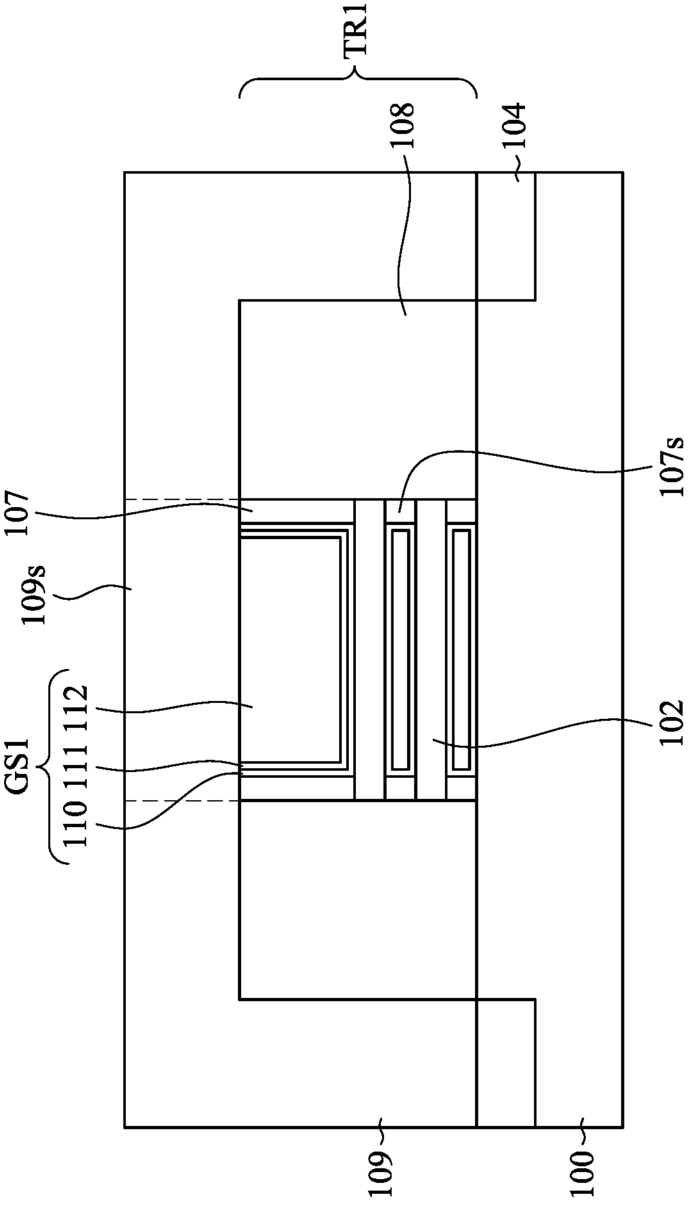

FIGS. 8A and 8B respectively illustrate a cross-sectional view and a top view of a replacement gate structure GS1. In FIGS. 8A and 8B, a replacement gate structure GS1 is formed in the gate trench GT1 to surround each of the nanosheets 102 suspended in the gate trench GT1. The gate structure GS1 may be a final gate of a bottom GAA FET. The final gate structure may be a high-k/metal gate stack, however other compositions are possible. In some embodiments, the gate structure GS1 forms the gate associated with the multi-channels provided by the plurality of nanosheets 102. For example, high-k/metal gate structure GS1 is formed within the sheet-to-sheet spaces provided by the release of the second nanostructures 102. In various embodiments, the high-k/metal gate structure GS1 includes a high-k gate dielectric layer 110 formed around the nanosheets 102, one or more work function metal layers 111 formed around the high-k gate dielectric layer 110, and a fill metal layer 112 formed around the one or more work function metal layers 111 and filling a remainder of the gate trench GT1. Formation of the high-k/metal gate structure GS1 may include one or more deposition processes to form various gate materials, followed by an etch back process to remove excessive gate materials, resulting in the high-k/metal gate structure GS1 having a top surface lower than a top surface of the ILD layer 109. The high-k/metal gate structure GS1 surrounds each of the nanosheets 102, and thus is referred to as a gate of a bottom GAA FET, labeled "TR1".

In some embodiments, the high-k gate dielectric layer 110 includes silicon carbonnitride (SiCN) with a dielectric constant of about 4.9, silicon nitride ($Si_3N_4$) with a dielectric constant of about 7.1, aluminum oxide ($Al_2O_3$) with a dielectric constant of about 9, silicon oxide ($SiO_2$) with a dielectric constant (i.e., k value) of about 3.9, hafnium oxide ($HfO_2$) with a dielectric constant of about 20, zirconium oxide ($ZrO_2$) with a dielectric constant of about 40, titanium oxide ($TiO_2$) with a dielectric constant of about 95, tantalum oxide ($Ta_2O_5$) with a dielectric constant of about 26, hafnium zirconium oxide ($H_2O$) with a dielectric constant of about 20 to about 45, lead zirconate titanate (PZT), e.g., $PbZr_{0.52}Ti_{0.48}O_3$, with a dielectric constant of about 1400 to about 1800, yttrium oxide ($Y_2O_3$) with a dielectric constant of about 14 to about 18, poly[(vinylidenefluoride-co-trifluoroethylene] (P(VDF/TrFE)) with a dielectric constant of about 14-18, and/or barium titanium oxide ($BaTi_3$) with a dielectric constant greater than about 200.

In some embodiments, the work function metal layer 111 includes one or more n-type work function metal (N-metal) layers and/or one or more p-type work function metal (P-metal) layers. The n-type work function metal may exemplarily include, but are not limited to, titanium aluminide (TiAl), titanium aluminium nitride (TiAlN), carbonitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. The p-type work function metal may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. In some embodiments, the fill metal 112 may exemplarily include, but are not limited to, Pt, Ti, TiN, Al, W. WN, Ru, RuO, Ta, Ni, Co, Cu, Ag. Au, or other suitable materials.

After forming the replacement gate structure GS1, a refill dielectric 109*s* is deposited over the replacement gate structure GS1. In some embodiments, the refill dielectric 109*s* may be deposited by any suitable method, such as CVD, plasma-enhanced CVD (PECVD), or FCVD. Dielectric material(s) of the refill dielectric 109*s* may be the same as that of the ILD layer 109. For example, the refill dielectric 109*s* may include phospho-silicate glass (PSG), boro-silicate glass (BSG), boron-doped phospho-silicate glass (BPSG), undoped silicate glass (USG), or the like. The refill dielectric 109*s* and the previously formed ILD layer 109 are distinguished by using dash lines in FIG. 8A, but the dash lines are omitted in following figures for the sake of clarity. Fabrication of the transistor TR1 can be referred to as front-end-of-line (FEOL) processing.

Figure 9A:
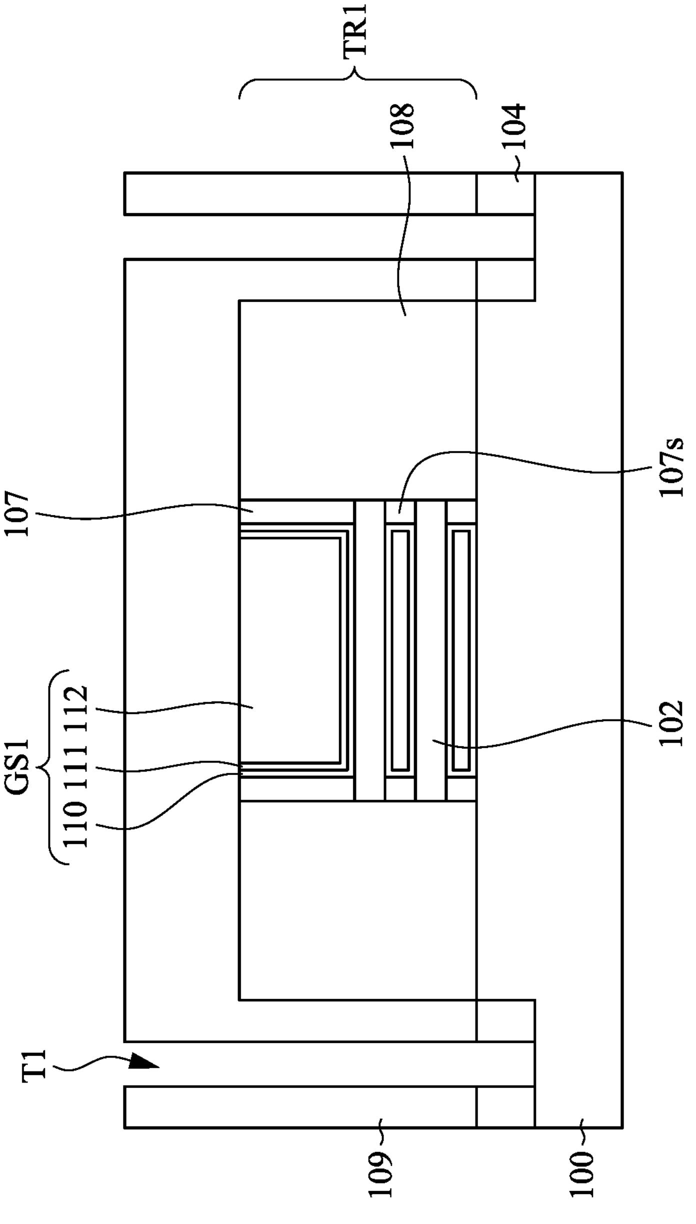
Figure 9B:
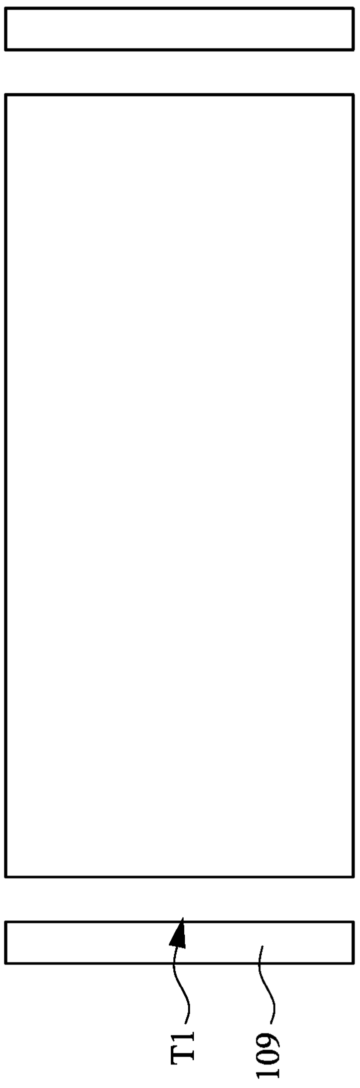

FIGS. 9A-9B illustrate respectively illustrate a cross-sectional view and a top view of trenches formed in the ILD layer 109. In FIGS. 9A-9B, a patterning process is performed on the ILD layer 109 and the STI regions 104 to form one or more trenches T1 in the ILD layer 109 and the STI regions 104, until the substrate 100 gets exposed at bottoms of the trenches T1. The trenches T1 thus extend through a full thickness of the ILD layer 109 and a full thickness of the STI regions 104 to reach the substrate 100. In some embodiments, the number of trench T1 may be in a range from 1 to 101.

The ILD layer 109 and the STI regions 104 are patterned using suitable photolithography and etching techniques. For example, a photoresist layer is formed over the ILD layer 109 by using a spin-on coating process, followed by patterning the photoresist layer to expose target regions of the ILD layer 109 using suitable photolithography techniques. For example, photoresist layer is irradiated (exposed) and developed to remove portions of the photoresist layer. In greater detail, a photomask or reticle (not shown) may be placed above the photoresist layer, which may then be exposed to a radiation beam which may be ultraviolet (UV) or an excimer laser such as a Krypton Fluoride (KrF) excimer laser, or an Argon Fluoride (ArF) excimer laser. Exposure of the photoresist material may be performed, for example, using an immersion lithography tool or an extreme ultraviolet light (EUV) tool to increase resolution and decrease the minimum achievable pitch. A bake or cure operation may be performed to harden the exposed photoresist layer, and a developer may be used to remove either the exposed or unexposed portions of the photoresist material depending on whether a positive or negative resist is used. After the patterned photoresist layer is formed, an etching process is performed on the exposed target regions of the ILD layer 109, thus forming trenches T1 in the ILD layer 109 and the underlying STI regions 104.

Figure 9C:
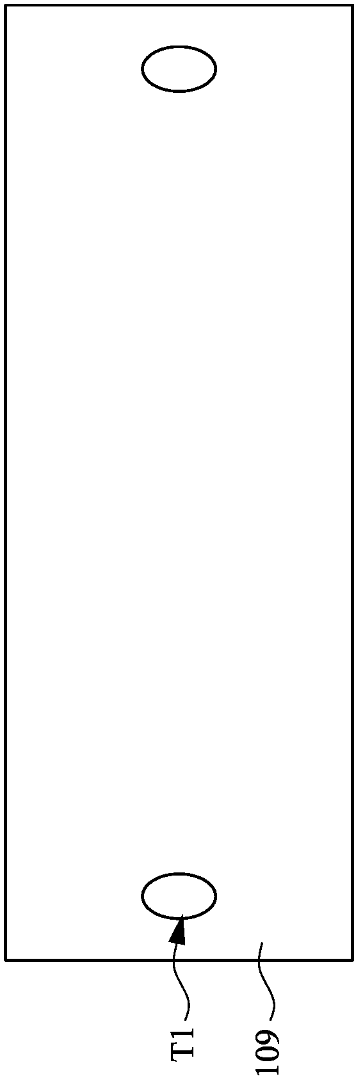

Although the trenches T1 illustrated in FIG. 9A have vertical sidewalls, the etching process may lead to tapered sidewalls in some other embodiments. In some embodiments as illustrated in FIG. 9B, the trenches T1 have a strip shape from top view. In some embodiments as illustrated in FIG. 9C, the trenches T have a round shape (e.g., circle or ellipse) from a top view.

Figure 10:
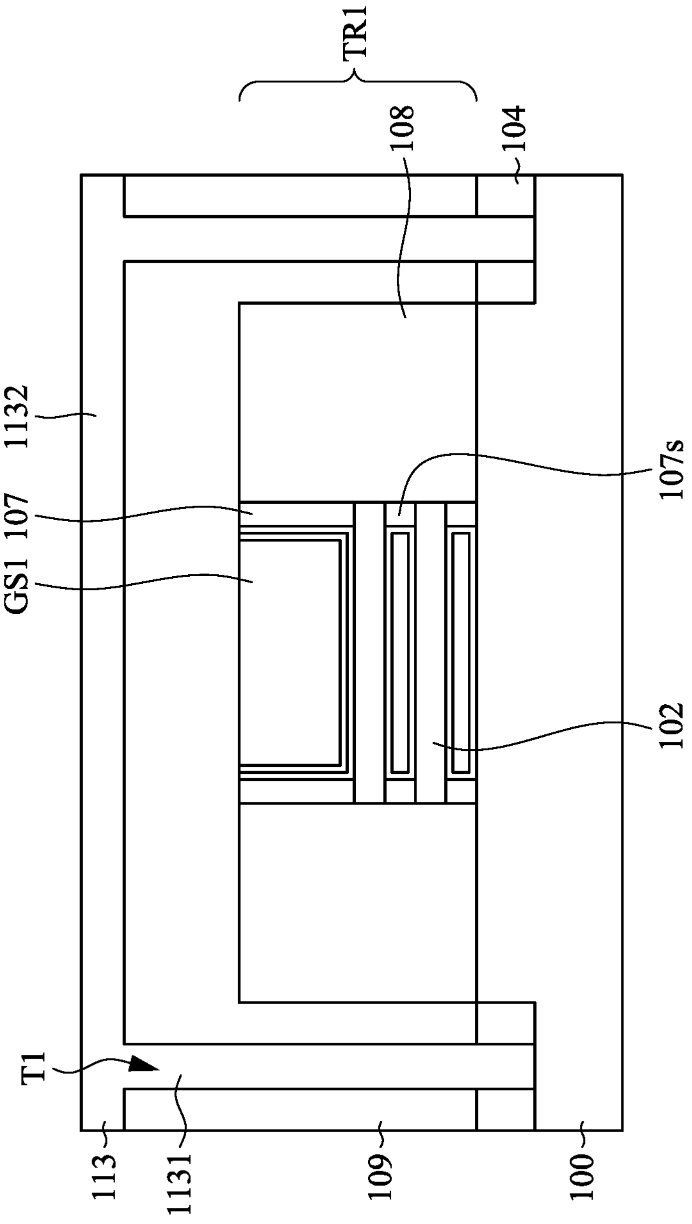

FIG. 10 illustrates a cross-sectional view of a following stage in the 3D IC structure fabrication. As illustrated in FIG. 10, an amorphous silicon layer (i.e., amorphous semiconductor layer) 113 is formed over the ILD layer 109 using CVD. ALD, the like, or other suitable processes. In some embodiments, the amorphous silicon layer 113 may be deposited by using silicon-containing gases (e.g., $SiH_4$, $Si_2H_6$, $Si_3H_8$) as precursor gases. The amorphous silicon layer may be deposited, for example, at a flow rate of the silicon-containing gas in the range from about 800 standard cubic centimeters per minute (sccm) to about 2200 sccm, at a temperature in a rage from about 300 degrees Centigrade to about 700 degrees Centigrade, at a pressure in a range from about 500 mTorr to about 1 Torr. These process conditions for forming the amorphous silicon layer 113 is intended to be illustrative and is not intended to be limiting to embodiments of the present disclosure. Rather, any suitable processes and associated process conditions may be used.

Silicon atoms deposited on the ILD layer 109 tend to form an amorphous solid (i.e., non-crystalline solid) that lacks the long-range order of a crystal, because the dielectric material in the ILD layer 109 is amorphous in nature. At an initial stage, the amorphous silicon layer 113 is conformally deposited into the trenches T1 in the ILD layer 109 and STI regions 104 and on a top surface of the ILD layer 109, and the deposition process then continues until the trences T1 are overfilled with the amorphous silicon layer 113.

As a result of the deposition process, the amorphous silicon layer 113 includes amorphous silicon plugs 1131 extending in the trences T1 in the ILD layer 109, and an amorphous silicon lateral portion 1132 extending along a top surface of the ILD layer 109. Height of the amorphous silicon plugs 1131 is equal to the depth of the trenches T1, and thus is greater than a full thickness of the ILD layer 109 and a full thickness of the STI regions 104. Thickness of the amorphous silicon lateral portion 1132 can be less than, greater than, or equal to the height of the amorphous silicon plugs 1131. In some embodiments, the height of amorphous silicon plugs 1131 is greater than the width of the amorphous silicon plugs 1131.

Figure 11:
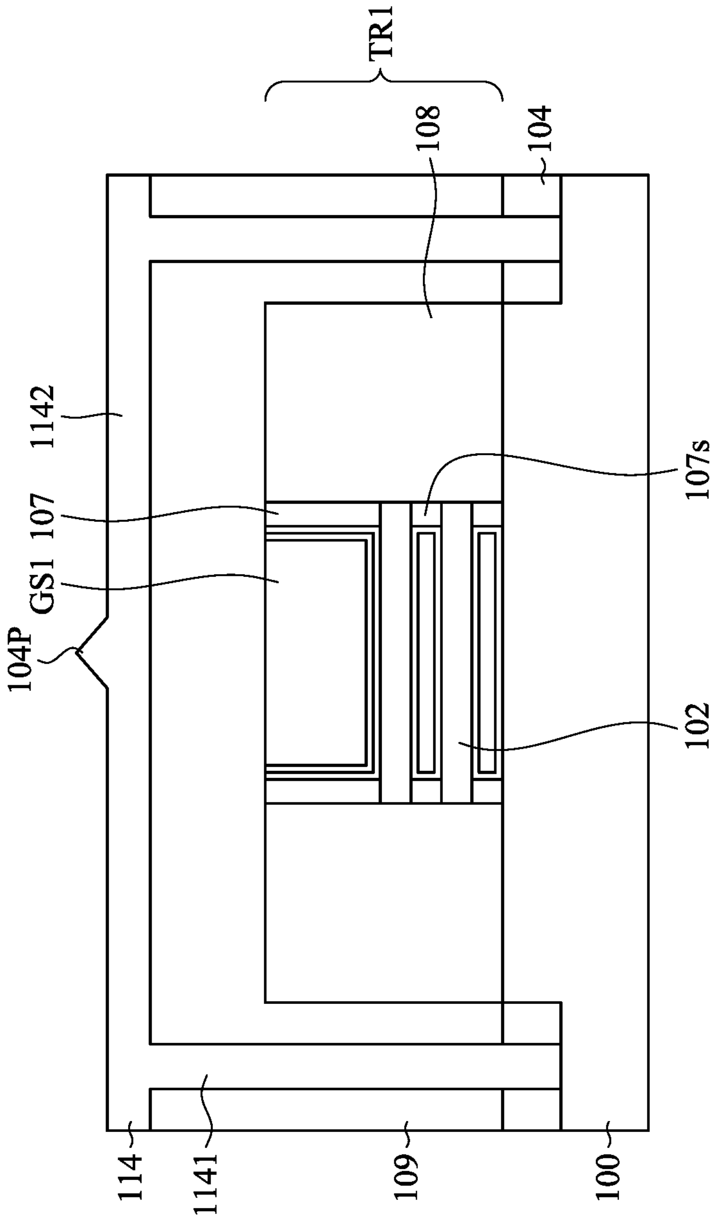

In FIG. 11, a crystallization process is performed to convert the amorphous silicon layer 113 into a crystalline silicon layer 114. In some embodiments, crystallization of the amorphous silicon layer 113 can be performed using, for example, a laser anneal, a rapid thermal anneal (RTA), a millisecond anneal (mSA), the like or combinations thereof, which raises temperature to a peak temperature higher than deposition temperature of the amorphous silicon layer 113. In greater detail, the amorphous silicon layer 113 can heated to a peak temperature higher than a melting point of amorphous silicon layer 113, so as to melt the amorphous silicon layer 113 into a molten state (i.e., liquid phase), and then the molten amorphous silicon will be crystallized upon cooling down. Because crystallization of the molten amorphous silicon takes place using the underlying single-crystalline substrate 100 as a seed layer, the resultant crystallized silicon layer 114 will be single-crystalline, and thus can be referred to as a crystalline silicon layer 114. When the amorphous silicon layer 113 is crystallized using a laser anneal, this crystallization process can be also called laser-liquid-phase-epitaxy (LLPE) process, which results in a single crystalline silicon layer that can serve as a seed layer for following epitaxial growth for forming a top epitaxial stack. In some embodiments, the crystalline silicon layer 114 may have a different shape and/or size than the amorphous silicon layer 113, because the crystallization process turns the silicon material from a solid phase into liquid phase. By way of example and not limitation, after the molten amorphous silicon is crystallized into a solid phase, the crystalline silicon layer 114 may have protrusions 114P located above the gate structure GS1.

As illustrated in FIG. 11, the crystalline silicon layer 114 includes crystalline silicon plugs 1141 extending in the trenches T1 in the ILD layer 109, and a crystalline silicon lateral portion 1142 extending along a top surface of the ILD layer 109. Height of the crystalline silicon plugs 1141 is equal to the depth of the trenches T1, and thus is greater than a full thickness of the ILD layer 109 and a full thickness of the STI regions 104. Thickness of the crystalline silicon lateral portion 1142 can be less than, greater than, or equal to the height of the crystalline silicon plugs 1141. In some embodiments, the height of crystalline silicon plugs 1141 is greater than the width of the crystalline silicon plugs 1141. The crystalline silicon plugs 1141 are formed of a same material as the crystalline silicon lateral portion 1142, because they are epitaxially grown in a same LLPE process.

Figure 12A:
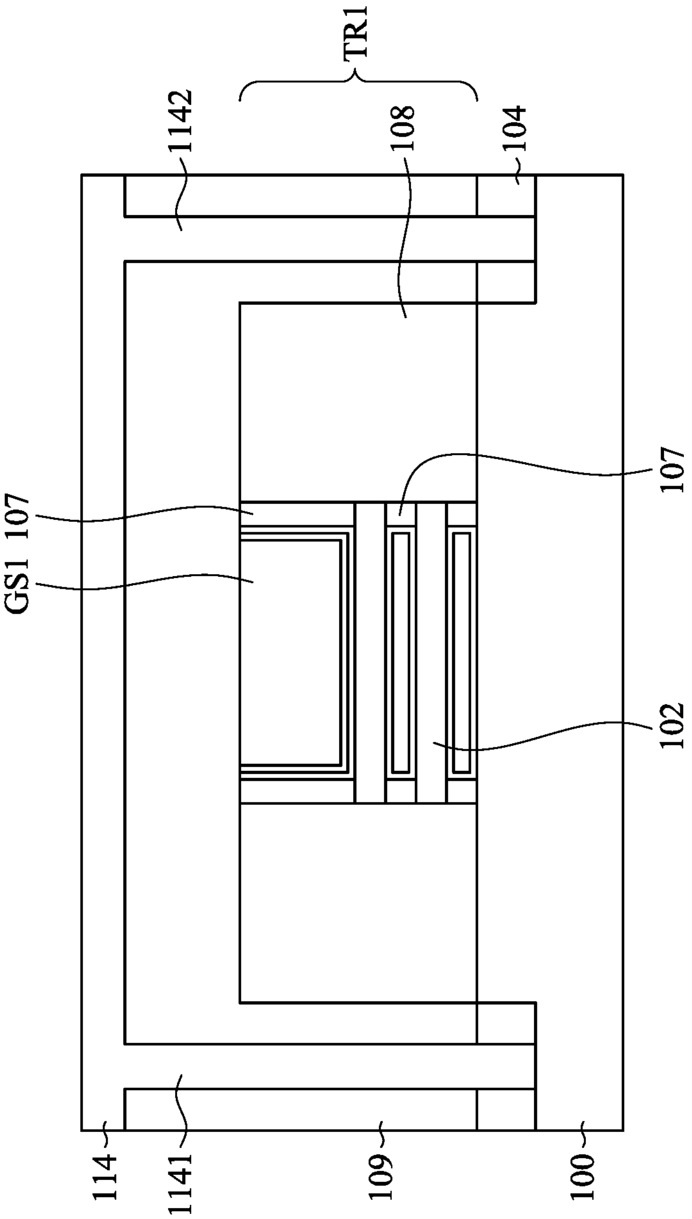
Figure 12B:
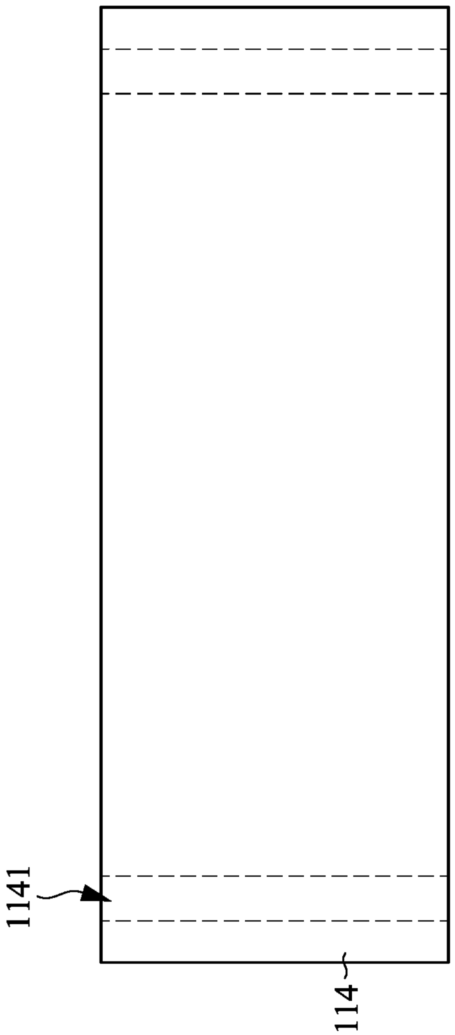
Figure 12C:
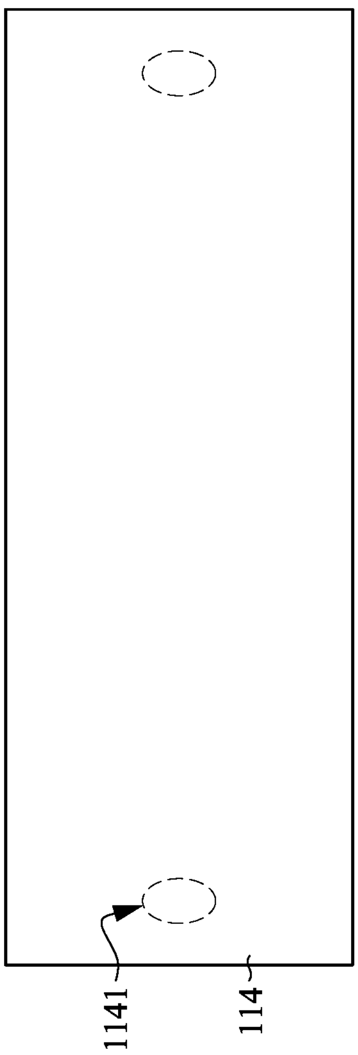

Next, a CMP process is performed on the crystalline silicon layer 114 to remove the protrusions 114P. The resultant structure is illustrated in FIG. 12A. FIGS. 12B and 12C are top views illustrating example top-view profiles of the crystalline silicon plugs. In some embodiments as illustrated in FIG. 12B, the crystalline silicon plugs 1141 have a strip shape (illustrated in dash lines) from top view. In some embodiments as illustrated in FIG. 12C, the crystalline silicon plugs have a round shape (e.g., circle or ellipse, illustrated in dash lines) from a top view.

Figure 13:
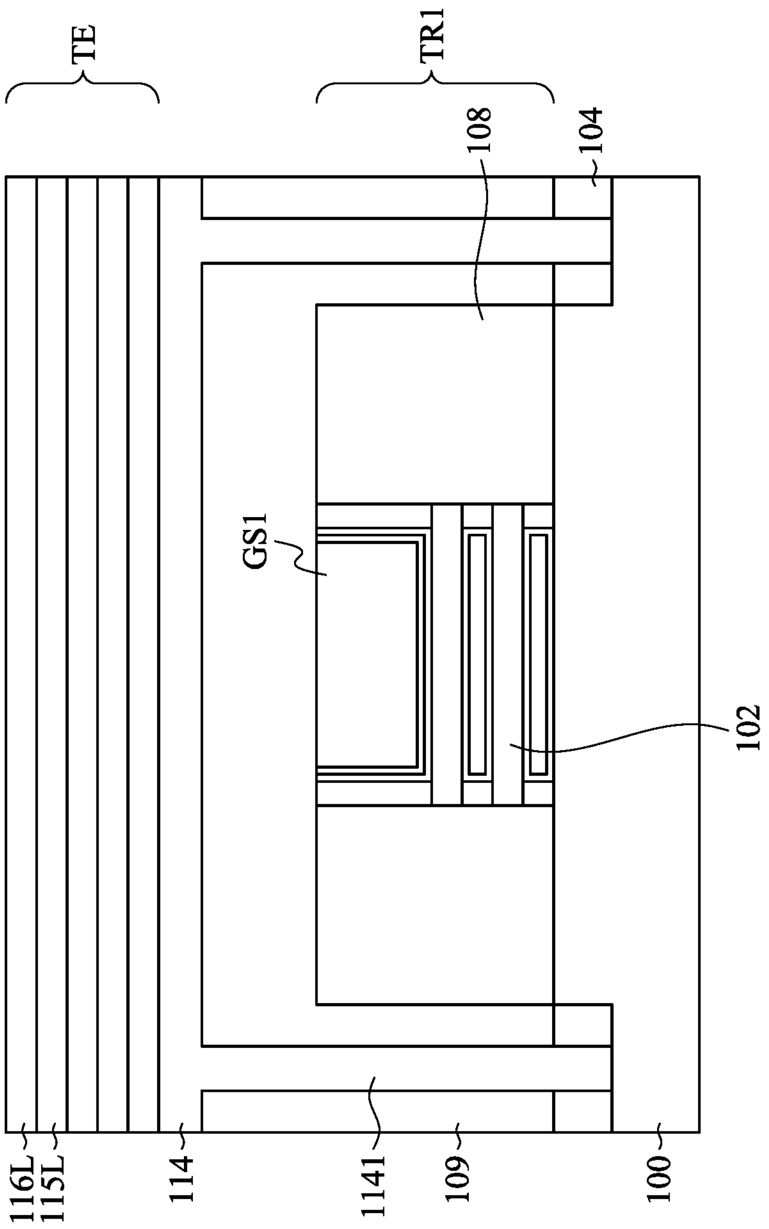

In FIG. 13, a top epitaxial stack TE is formed over the crystalline silicon layer 114. The top epitaxial stack TE is a multi-layer stack comprising one or more first semiconductor layers 116L alternating with one or more second semiconductor layers 115L. For purposes of illustration and as discussed in greater detail below, the first semiconductor layers 116L serve as sacrificial layers that will be removed and the second semiconductor layers 115L serve as channel layers that will be patterned to form channel regions of top GAA-FETs.

The top epitaxial stack TE is illustrated as including three first semiconductor layers 116L and two second semiconductor layers 115L for illustrative purposes. In some embodiments, the bottom epitaxial stack TE may include any number of the first semiconductor layers 116L and the second semiconductor layers 115L. Each of the layers of the bottom epitaxial stack TE may be epitaxially grown using a process such as chemical vapor deposition (CVD), atomic layer deposition (ALD), vapor phase epitaxy (VPE), molecular beam epitaxy (MBE), or the like. The bottommost layer of the top epitaxial stack TE (i.e., bottommost one of the first semiconductor layers 116L) is epitaxially grown using the crystalline silicon layer 114 as a seed layer, and thus the resultant bottommost first semiconductor layer 116L and overlying semiconductor layers will be single-crystalline.

The first semiconductor layers 116L and the second semiconductor layers 115L may be materials having a high-etch selectivity to one another. As such, the first semiconductor layers 116L of a first semiconductor material may be removed without significantly removing the second semiconductor layers 115L of a second semiconductor material, thereby allowing the second semiconductor layers 115L to serve as channel regions of top GAA-FETs. In various embodiments, the first semiconductor layers 116L and the second semiconductor layers 115L are made of different materials selected from the group consisting of Si, Ge, Sn, $Si_{1-x}Ge_x$, $Ge_{1-y}Sn_y$, $Si_{1-x-y}Ge_xSn_y$, III-V compound, and combinations thereof. Because of the material difference, in subsequent processing, the first semiconductor layers 116L can be selectively etched without substantially etching the second semiconductor layers 115L. In some embodiments, the channel layers 115L are formed of a different material than the nanosheets 102 of the bottom GAA transistor TR1. For example, the nanosheets 102 may be Si nanosheets, while the channel layers 115L are GeSn layers, which allows the subsequently formed top transistor TR2 having different channel materials than the bottom transistor TR1.

Figure 14:
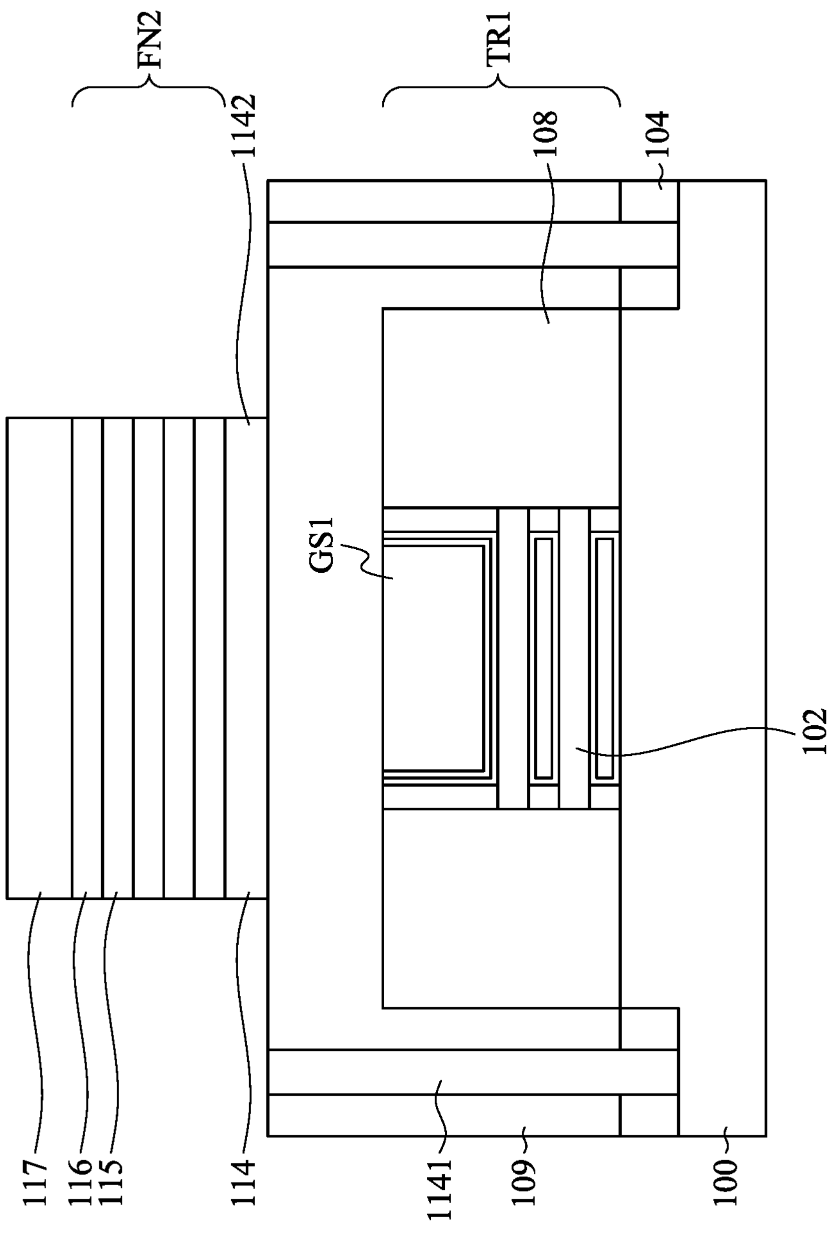

In FIG. 14, a fin structure FN2 is formed by etching trenches in the top epitaxial stack TE and the crystalline silicon layer 114. The etching may be any acceptable etch process, such as a reactive ion etch (RIE), neutral beam etch (NBE), the like, or a combination thereof. The etching may be anisotropic. Forming the fin structure FN2 by etching the epitaxial stack TE may further define first nanostructures 116 from the first semiconductor layers 116L and define second nanostructures 115 from the second semiconductor layers 115L. Forming the fin structure FN2 by etching the crystalline silicon layer 114 further removes portions of the crystalline silicon lateral portion 1142, such that a remaining portion of the crystalline silicon lateral portion 1142 is spaced apart from the crystalline silicon plugs 1141.

The fin structure FN2 may be patterned by any suitable method. For example, a hard mask 117 (e.g., formed of $SiO_2$) is first formed over the top epitaxial stack TE by using suitable deposition and patterning techniques, followed by patterning the top epitaxial stack TE into the fin structure FN2 by one or more etching processes using the hard mask 117 as an etch mask. While each of the fin structure FN2 is illustrated as having a consistent width throughout, in other embodiments, the fin structures FN2 may have tapered sidewalls such that a width of the fin structure FN2 continuously increases in a direction towards the crystalline silicon layer 114. In such embodiments, each of the nanostructures 115, 116 may have a different width and be trapezoidal in shape.

Figure 15:
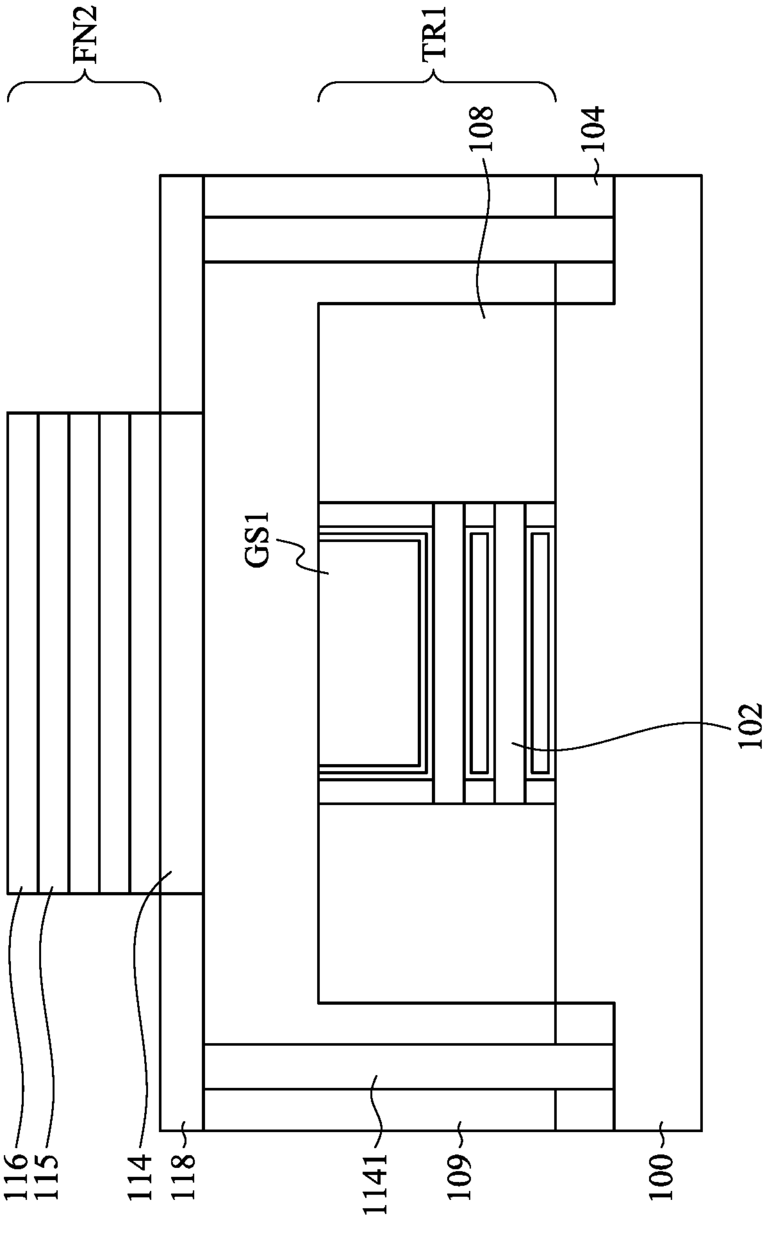
Figure 16:
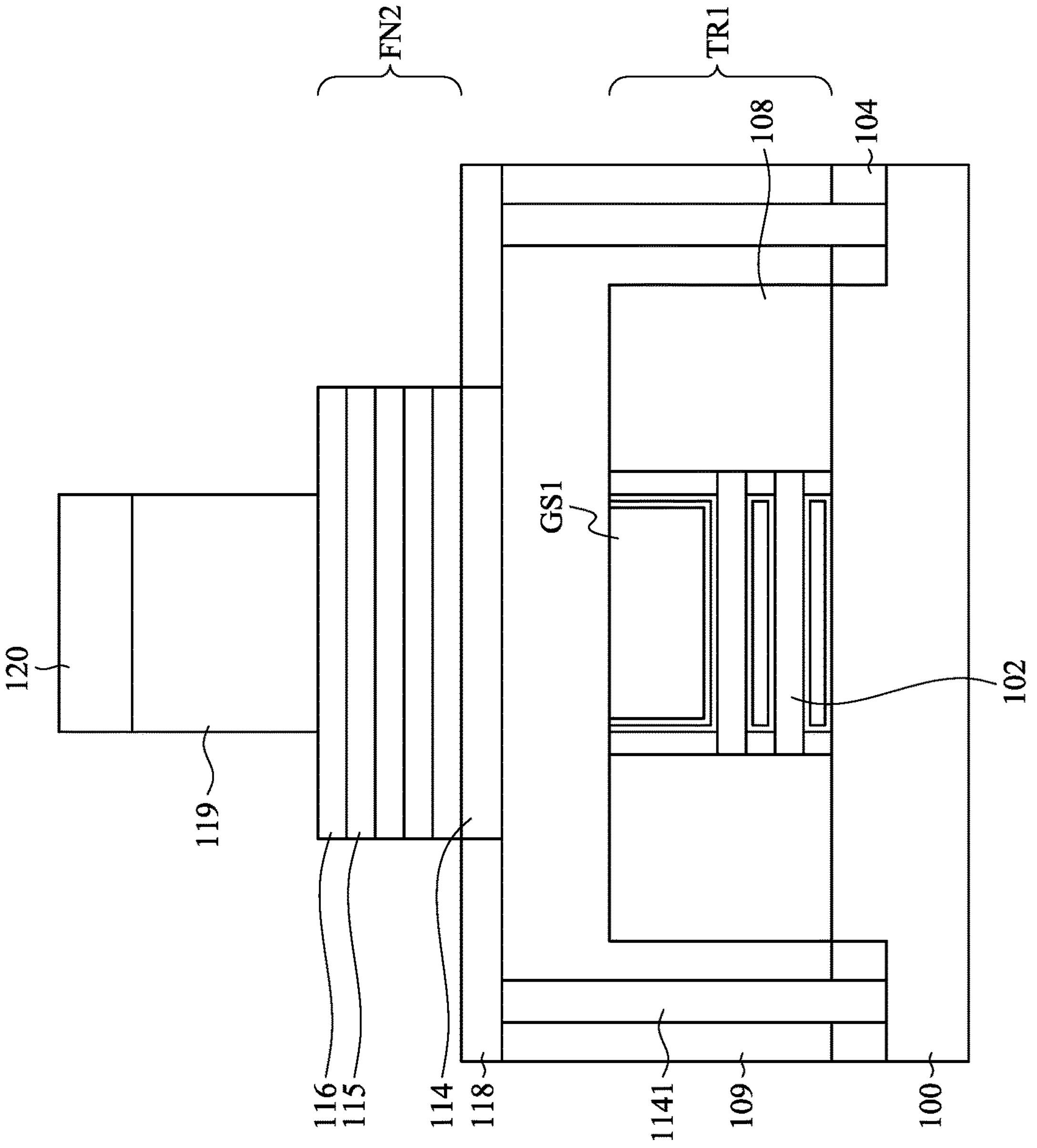

In FIG. 15, shallow trench isolation (STI) regions 118 are formed adjacent the fin structure FN2. The STI regions 118 may be formed by depositing an insulation material over the ILD layer 106 and the fin structure FN2, and between adjacent fin structures FN2. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 115, 116. Although the insulation material is illustrated as a single layer, some embodiments may utilize multiple layers. For example, in some embodiments a liner (not separately illustrated) may first be formed along a surface of the ILD layer 106, the fin structure FN2. Thereafter, a fill material, such as those discussed above may be formed over the liner.

A removal process is then applied to the insulation material to remove excess insulation material over the nanostructures 115, 116. In some embodiments, a planarization process such as a chemical mechanical polish (CMP), an etch-back process, combinations thereof, or the like may be utilized. The planarization process is performed until a topmost one of the first nanostructures 116 such that a top surface of the topmost one of the first nanostructures 116 and the insulation material are level after the planarization process is complete. In this way, the hard mask 117 can be removed by the planarization process.

The insulation material is then recessed to form the STI regions 118. The insulation material is recessed such that an upper portion of the fin structure FN2 protrudes from between neighboring STI regions 118. Further, the top surfaces of the STI regions 118 may have a flat surface as illustrated, a convex surface, a concave surface (such as dishing), or a combination thereof. The top surfaces of the STI regions 118 may be formed flat, convex, and/or concave by an appropriate etch. The STI regions 118 may be recessed using an acceptable etching process, such as one that is selective to the material of the insulation material (e.g., etches the material of the insulation material at a faster rate than the material of the fin structure FN2. For example, an oxide removal using, for example, dilute hydrofluoric (dHF) acid may be used.

In FIG. 4, a dummy gate structure 119 is formed across the fin structure FN2. The dummy gate structure 119 may include a dummy dielectric layer, for example, silicon oxide, silicon nitride, a combination thereof, or the like, and may be deposited or thermally grown according to acceptable techniques. The dummy gate structure 119 further includes a dummy gate layer formed over the dummy dielectric layer. The dummy gate layer may be deposited over the dummy dielectric layer and then planarized, such as by a CMP. A hard mask layer 120 (e.g., formed of $SiO_2$) may be deposited over the dummy gate layer. The dummy gate layer may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer may be deposited by physical vapor deposition (PVD), CVD, sputter deposition, or other techniques for depositing the selected material. The dummy gate layer may be made of other materials that have a high etching selectivity from the etching of isolation regions. The mask layer 120 may include, for example, silicon nitride, silicon oxynitride, or the like.

The mask layer 120 may be patterned using acceptable photolithography and etching techniques. The pattern of the mask layer 120 then may be transferred to the dummy gate layer and to the dummy dielectric layer to form the dummy gate structure 119. The dummy gate structure 119 covers respective the channel region of the fin structure FN2. The dummy gate structure 119 may also have a lengthwise direction substantially perpendicular to the lengthwise direction of the fin structure FN2.

Figure 17:
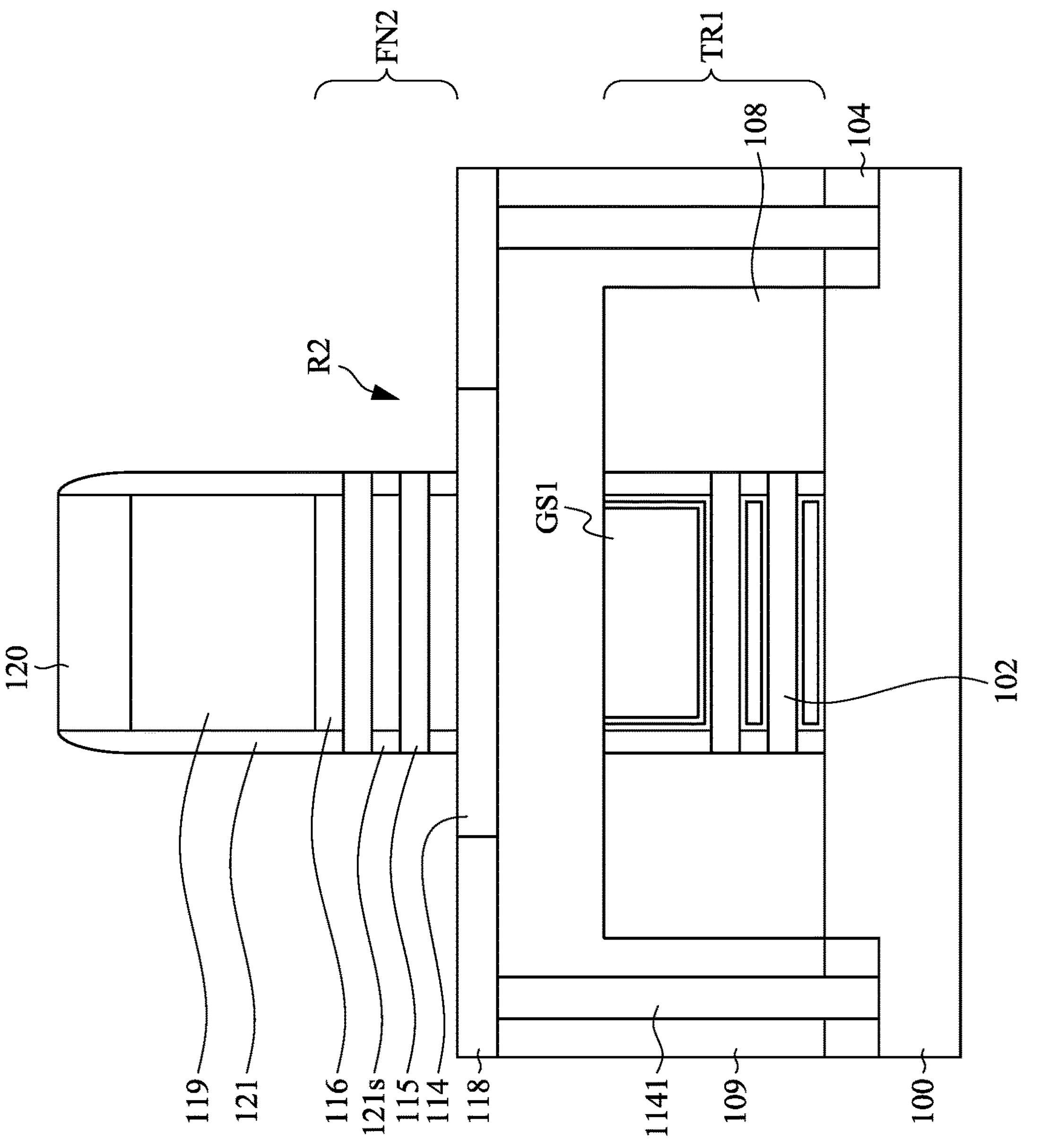

In FIG. 17, gate spacers 121 are formed on sidewalls of the dummy gate structure 119 and the hard mask layer 120. In some embodiments of the spacer formation step, a spacer material layer is deposited on the STI regions 118. The spacer material layer may be a conformal layer that is subsequently etched back to form gate sidewall spacers. In the illustrated embodiment, a spacer material layer is disposed conformally on top and sidewalls of the dummy gate structure 119. The spacer material layer may include a dielectric material such as silicon oxide, silicon nitride, silicon carbide, silicon oxynitride, SiCN films, silicon oxycarbide, SiOCN films, and/or combinations thereof. The spacer material layer may be formed by depositing a dielectric material over the dummy gate structure 119 using processes such as, CVD process, a subatmospheric CVD (SACVD) process, a flowable CVD process, an ALD process, a PVD process, or other suitable process. An anisotropic etching process is then performed on the deposited spacer material layer to expose portions of the fin structure FN2 not covered by the dummy gate structure 119. Portions of the spacer material layer directly above the dummy gate structure 119 may be completely removed by this anisotropic etching process. Portions of the spacer material layer on sidewalls of the dummy gate structure 119 may remain, forming gate sidewall spacers, which are denoted as the gate spacers 121, for the sake of simplicity.

Next, exposed portions of the fin structure FN2 that laterally extend beyond the hard mask layer 120 and the gate spacers 121 are etched to form source/drain recesses R2 at opposite sides of the dummy gate structure 119, by using the hard mask layer 120 and the gate spacers 121 as an etch mask. Thereafter, portions of sidewalls of the layers in the fin structure FN2 formed of the first semiconductor materials (e.g., the first nanostructures 101) exposed by the source/drain recesses R2 are etched to form sidewall recesses between corresponding second nanostructures 115, followed by forming inner spacers 121*s* in the sidewall recesses. The resulting structure is illustrated in FIG. 17. The inner spacers 121*s* act as isolation features between subsequently formed source/drain regions and gate structure. As will be discussed in greater detail below, source/drain regions will be formed in the source/drain recesses R1, and the first nanostructures 116 will be replaced with a final gate structure.

The inner spacers 121*s* may be formed by, for example, depositing an inner spacer material layer in the sidewall recesses by using a conformal deposition process, such as CVD, ALD, or the like, followed by anisotropically etching the inner spacer layer to remove excessive inner spacer materials outside the sidewall recesses, while leaving the remaining inner spacer materials in the sidewall recesses to serve as the inner spacers 121*s*. The inner spacers 121*s* may comprise a material such as silicon nitride or silicon oxynitride, although any suitable material, such as low-dielectric constant (low-k) materials having a k-value less than about 3.5, may be utilized. Although outer sidewalls of the inner spacers 121*s* are illustrated as being flush with sidewalls of the second nanostructures 115, the outer sidewalls of the inner spacers 121*s* may extend beyond or be recessed from sidewalls of the second nanostructures 115.

Figure 18:
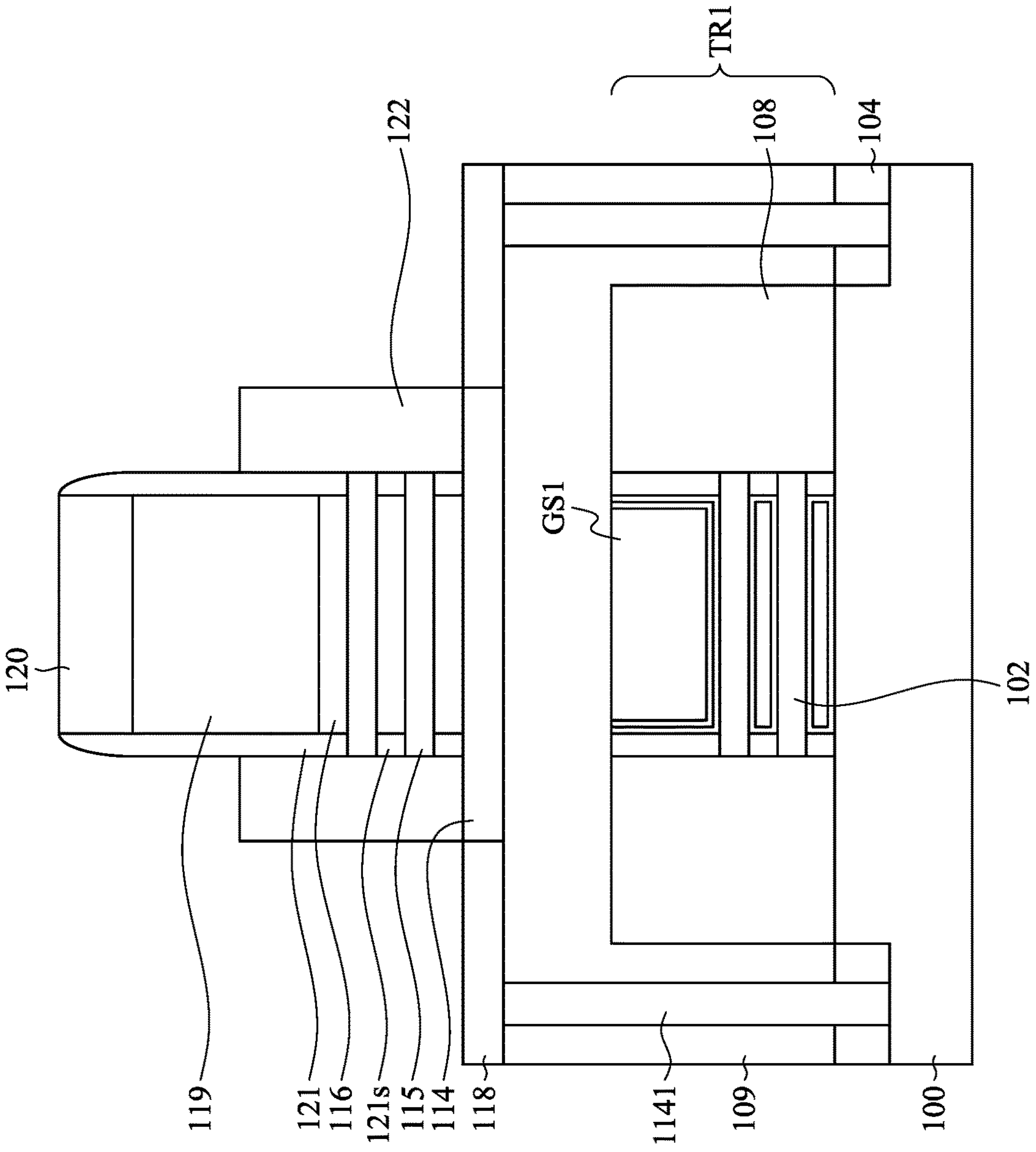

In FIG. 18, epitaxial source/drain regions 122 are formed in the source/drain recesses. In some embodiments, the source/drain regions 122 may exert stress on the second nanostructures 115, thereby improving device performance. As illustrated in FIG. 18, the epitaxial source/drain regions 122 are formed in the source/drain recesses such that the dummy gate structure 119 is disposed between respective neighboring pairs of the epitaxial source/drain regions 122. In some embodiments, the gate spacers 121 are used to separate the epitaxial source/drain regions 122 from the dummy gate structure 119, and the inner spacers 121*s* are used to separate the epitaxial source/drain regions 122 from the first nanostructures 116 by an appropriate lateral distance so that the epitaxial source/drain regions 122 do not short out with subsequently formed gates of the resulting top GAA-FET.

In some embodiments, the epitaxial source/drain regions 122 may include any acceptable material appropriate for n-type GAA-FETs. For example, if the second nanostructures 116 are silicon, the epitaxial source/drain regions 122 may include materials exerting a tensile strain on the second nanostructures 115, such as silicon carbide, phosphorous doped silicon carbide, silicon phosphide, or the like. In some embodiments, the epitaxial source/drain regions 122 may include any acceptable material appropriate for p-type GAA-FETs. For example, if the second nanostructures 115 are silicon, the epitaxial source/drain regions 122 may comprise materials exerting a compressive strain on the second nanostructures 115, such as silicon germanium, boron doped silicon germanium, germanium, germanium tin, or the like. The epitaxial source/drain regions 122 may be implanted with an n-type dopant (e.g., phosphorus) to form n-type source/drain regions or a p-type dopant (e.g., boron) to form p-type source/drain regions, followed by an anneal. In some embodiments, the epitaxial source/drain regions 122 may be in situ doped during growth. In some embodiments, the top source/drain regions 122 have different types of dopant than the bottom source/drain regions 108, which allows the subsequently formed top transistor TR2 being formed of a different conductivity type than the bottom transistor TR1. For example, the bottom source/drain regions 108 may include Si: P to serve as n-type source/drain regions, while the top source/drain regions 122 may include SiGe: B to serve as p-type source/drain regions.

Figure 19:
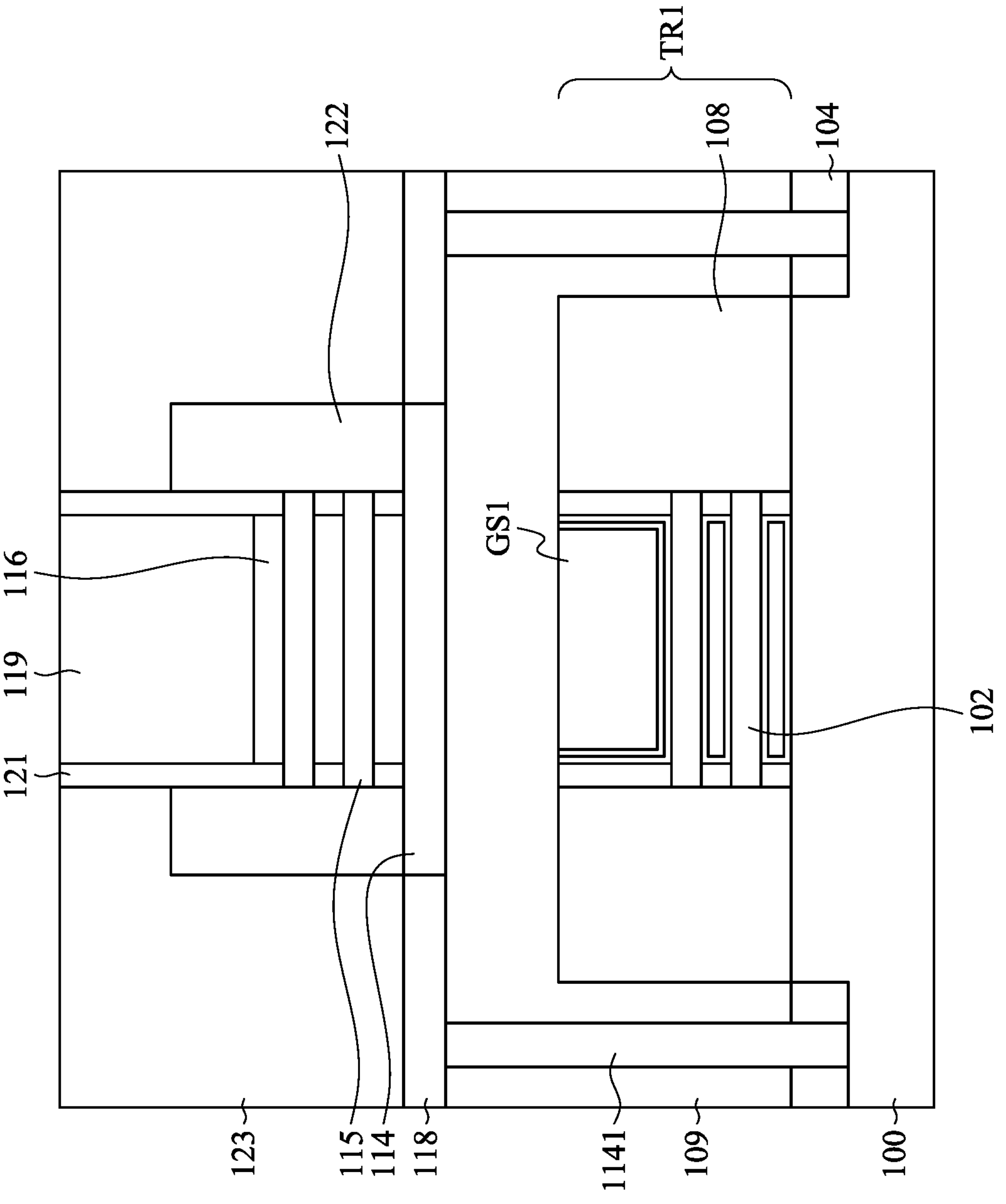

In FIG. 19, after forming the epitaxial source/drain regions 122, an ILD layer 123 is formed over the dummy gate structure 119 by using suitable deposition techniques, followed by performing a planarization process (e.g., CMP) on the ILD layer 230 until the dummy gate structure 105 is exposed. The patterned mask 120 is thus removed by the planarization process. In some embodiments, the ILD layer 123 may be deposited by any suitable method, such as CVD, plasma-enhanced CVD (PECVD), or FCVD. Dielectric material(s) of the ILD layer 123 may include phospho-silicate glass (PSG), boro-silicate glass (BSG), boron-doped phospho-silicate glass (BPSG), undoped silicate glass (USG), or the like. Other insulation materials formed by any acceptable process may be used. Then, a planarization process, such as a CMP, may be performed to level the top surface of the ILD layer 123 with the top surface of the dummy gate structure 119.

Figure 20:
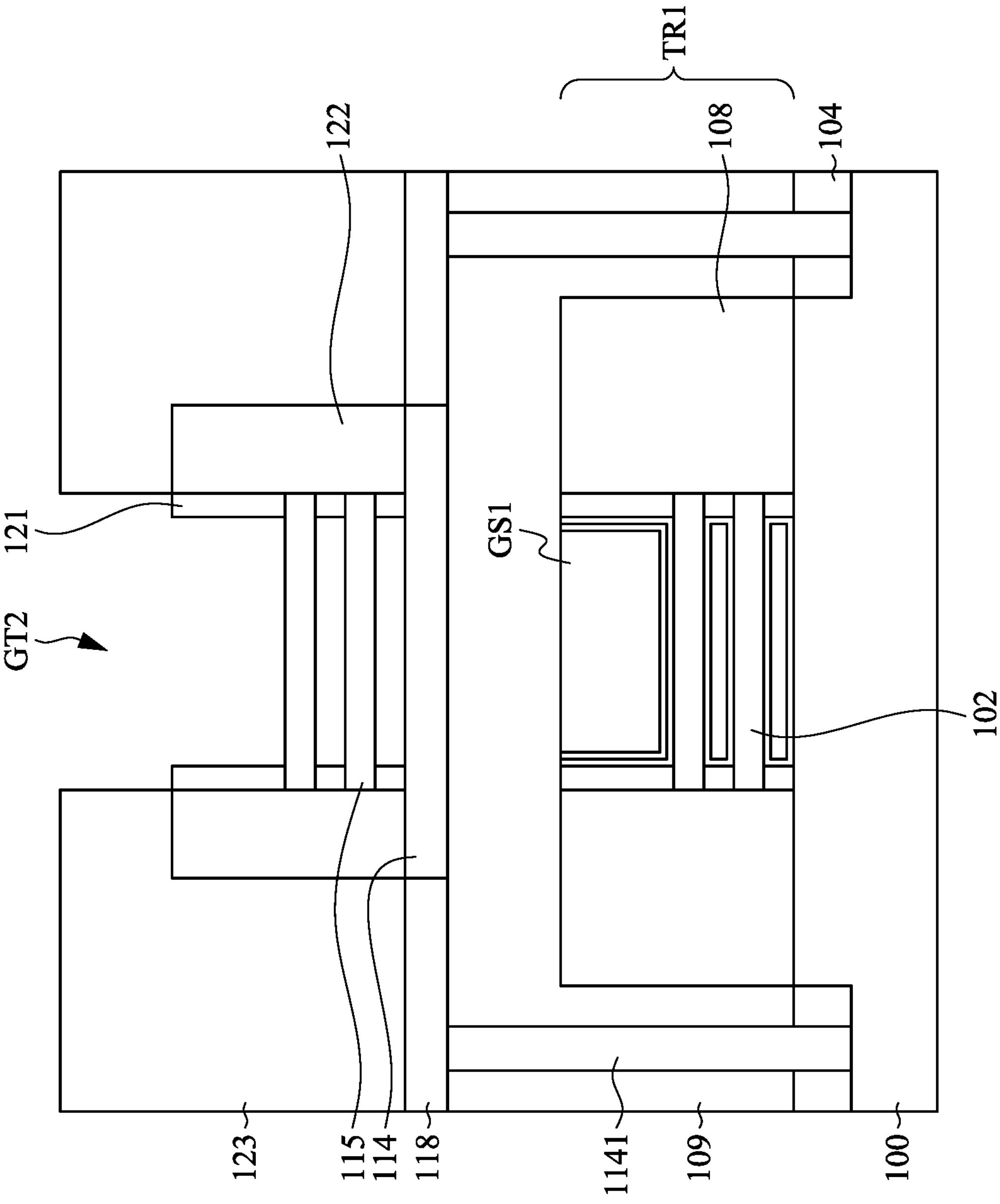

In FIG. 20, the dummy gate structure 119 is removed in one or more etching steps, so that a gate trench GT2 is formed between corresponding gate spacers 121. In some embodiments, the dummy gate structure 119 is removed by an anisotropic dry etch process. For example, the etching process may include a dry etch process using reaction gas(es) that selectively etch the dummy gate structure 119 at a faster etch rate than etching the gate spacers 121. In some embodiments, upper portions of the gate spacers 121 are also removed in the etching process of removing the dummy gate structure 119, such that remaining portions of the gate spacers 121 have top ends lower than the top surface of the ILD layer 123.

Next, the first nanostructures 116 in the gate trench GT2 are removed by an isotropic etching process such as wet etching or the like using etchants which are selective to the materials of the first nanostructures 116. Stated differently, the first nanostructures 116 are removed by using a selective etching process that etches the first nanostructures 116 at a faster etch rate than it etches the second nanostructures 115, thus forming spaces between the second nanostructures 115 (also referred to as sheet-to-sheet spaces if the nanostructures 115 are nanosheets). This step can be referred to as a channel release process. At this interim processing step, the spaces between second nanostructures 115 may be filled with ambient environment conditions (e.g., air, nitrogen, etc). In some embodiments, the second nanostructures 115 can be referred to as nanosheets, nanowires, nanoslabs, nanorings having nano-scale size (e.g., a few nanometers), depending on their geometry. For example, in some embodiments the second nanostructures 115 may be trimmed to have a substantial rounded shape (i.e., cylindrical) due to the selective etching process for completely removing the first nanostructures 116. In that case, the resultant second nanostructures 115 can be called nanowires. In embodiments in which the first nanostructures 116 include, e.g., SiGe, and the second nanostructures 115 include, e.g., Si or SiC, tetramethylammonium hydroxide (TMAH), ammonium hydroxide ($NH_4OH$) or the like may be used to remove the first nanostructures 116. In some embodiments, the second nanostructures 115 (also referred to as nanosheets) each have a thickness in a range from about 0.1 nm to about 100 nm, and a width in a range from about 0.1 nm to about 100 nm. In some embodiments, the cross-section profile of the second nanostructures 115 can be rectangular, square, circular, diamond, etc., with or without rounded corners. In some embodiments, the number of the nanostructures 115 in the top transistor TR2 is different from the number of the nanostructures 102 in the bottom transistor TR1.

Figure 21B:
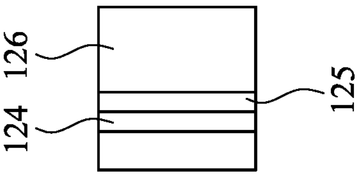
Figure 21A:
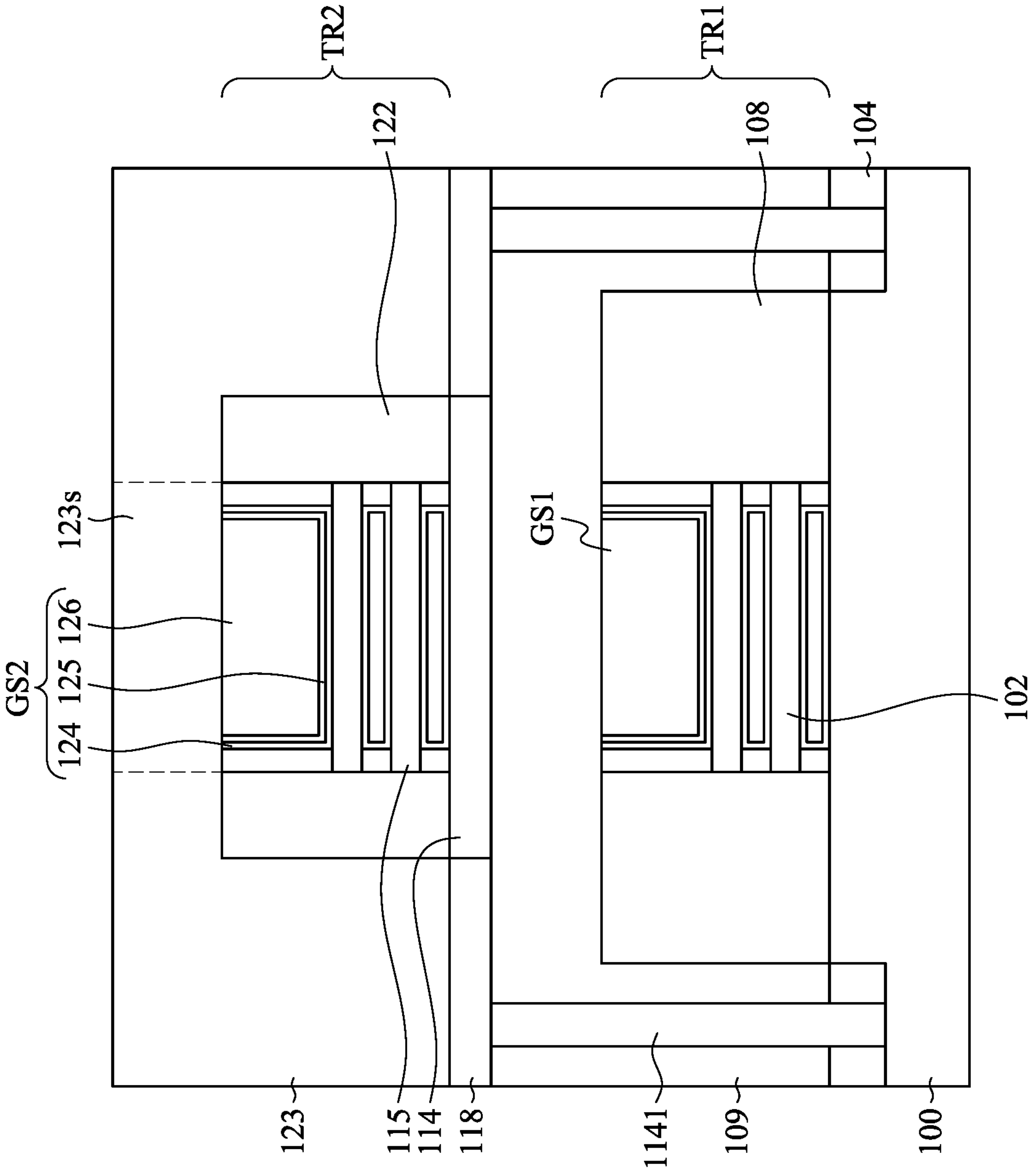

FIGS. 21A and 21B respectively illustrate a cross-sectional view and a top view of a replacement gate structure GS2. In FIGS. 21A and 21B, a replacement gate structure GS2 is formed in the gate trench GT2 to surround each of the nanosheets 115 suspended in the gate trench GT2. The gate structure GS2 may be a final gate of a top GAA FET, labeled "TR2". The final gate structure may be a high-k/metal gate stack, however other compositions are possible. In some embodiments, the gate structure GS2 forms the gate associated with the multi-channels provided by the plurality of nanosheets 115. For example, high-k/metal gate structure GS2 is formed within the sheet-to-sheet spaces provided by the release of the second nanostructures 115. In various embodiments, the high-k/metal gate structure GS2 includes a high-k gate dielectric layer 124 formed around the nanosheets 115, one or more work function metal layers 125 formed around the high-k gate dielectric layer 124, and a fill metal layer 126 formed around the one or more work function metal layers 125 and filling a remainder of the gate trench GT2. Formation of the high-k/metal gate structure GS2 may include one or more deposition processes to form various gate materials, followed by an etch back process to remove excessive gate materials, resulting in the high-k/metal gate structure GS2 having a top surface lower than a top surface of the ILD layer 123. The high-k/metal gate structure GS2 surrounds each of the nanosheets 115, and thus is referred to as a gate of a top GAA FET.

In some embodiments, the high-k gate dielectric layer 124 includes silicon carbonnitride (SiCN) with a dielectric constant of about 4.9, silicon nitride ($Si_3N_4$) with a dielectric constant of about 7.1, aluminum oxide ($Al_2O_3$) with a dielectric constant of about 9, silicon oxide ($SiO_2$) with a dielectric constant (i.e., k value) of about 3.9, hafnium oxide ($HfO_2$) with a dielectric constant of about 20, zirconium oxide ($ZrO_2$) with a dielectric constant of about 40, titanium oxide ($TiO_2$) with a dielectric constant of about 95, tantalum oxide ($Ta_2O_5$) with a dielectric constant of about 26, hafnium zirconium oxide ($H_2O$) with a dielectric constant of about 20 to about 45, lead zirconate titanate (PZT), e.g., $PbZr_{0.52}Ti_{0.48}O_3$, with a dielectric constant of about 1400 to about 1800, yttrium oxide ($Y_2O_3$) with a dielectric constant of about 14 to about 18, poly[(vinylidenefluoride-co-trifluoroethylene] (P(VDF/TrFE)) with a dielectric constant of about 14-18, and/or barium titanium oxide ($BaTiO_3$) with a dielectric constant greater than about 200.

In some embodiments, the work function metal layer 125 includes one or more n-type work function metal (N-metal) layers and/or one or more p-type work function metal (P-metal) layers. The n-type work function metal may exemplarily include, but are not limited to, titanium aluminide (TiAl), titanium aluminium nitride (TiAlN), carbonitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. The p-type work function metal may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. In some embodiments, the fill metal 126 may exemplarily include, but are not limited to, Pt, Ti, TiN, Al, W, WN, Ru, RuO, Ta, Ni, Co, Cu, Ag, Au, or other suitable materials. In some embodiments where the bottom transistor TR1 and the top transistor TR2 are of different conductivity types, the bottom gate structure GS1 may have a different work function metal composition than the top gate structure GS2. For example, the work function metal layer 125 the top gate structure GS2 may include one or more metals different from that of the work function metal layer 111 of the bottom gate structure GS1.

After forming the replacement gate structure GS2, a refill dielectric 123*s* is deposited over the replacement gate structure GS2. In some embodiments, the refill dielectric 123*s* may be deposited by any suitable method, such as CVD, plasma-enhanced CVD (PECVD), or FCVD. Dielectric material(s) of the refill dielectric 123*s* may be the same as that of the ILD layer 123. For example, the refill dielectric 123*s* may include phospho-silicate glass (PSG), boro-silicate glass (BSG), boron-doped phospho-silicate glass (BPSG), undoped silicate glass (USG), or the like. The refill dielectric 123*s* and the previously formed ILD layer 123 are distinguished by using dash lines in FIG. 21A, but the dash lines are omitted in following figures for the sake of clarity. Fabrication of the transistor TR2 can be referred to as another FEOL processing subsequent to the FEOL process for fabrication of the transistor TR1.

Figure 22B:
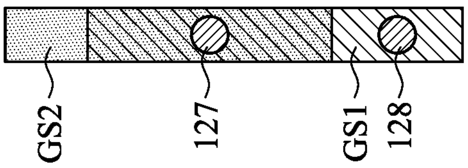
Figure 22A:
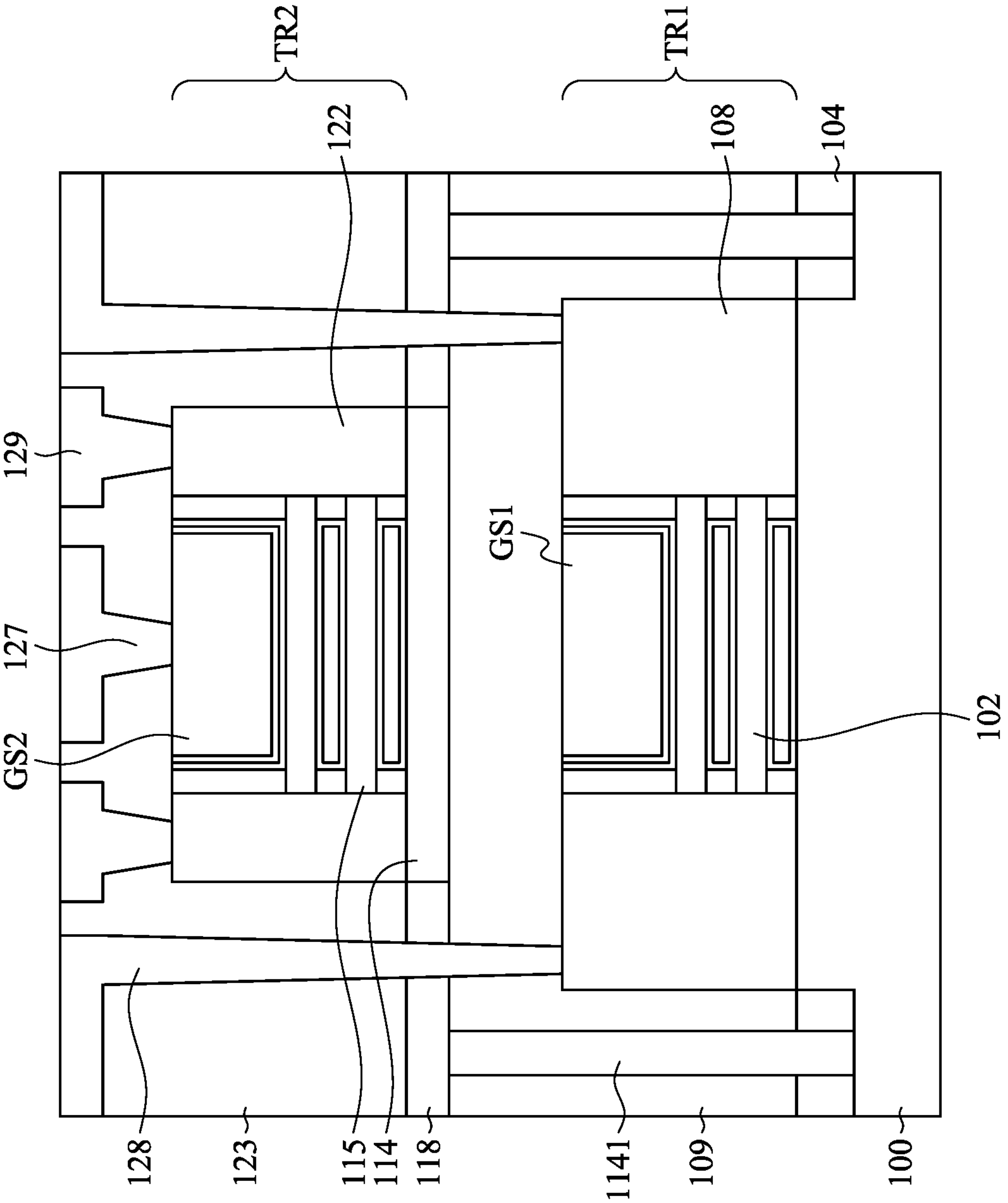

In FIG. 22A, back-end-of-line (BEOL) processing is performed to form shallow vias 127, deep vias 128 and metal lines 129 in the ILD layer 123 by using, for example, a dual damascene process. The shallow vias 127 serve to couple source/drain regions 122 and gate structures GS2 of the top GAA-FETs to the metal lines 129. The deep vias 128 serve to couple source/drain regions 108 and gate structures GS1 of the bottom GAA-FETs to the metal lines 129. Thus, the deep vias 128 have a greater height than the shallow vias 127. For example, the deep vias 128 extend through the upper ILD layer 123, the upper STI regions 118 into the lower ILD layer 109 to reach the source/drain regions 108 of the bottom GAA-FETs. In a top view as illustrated in FIG. 22B, the bottom gate structure GS1 has a portion laterally extending beyond a longitudinal end of the top gate structure GS2, thus allowing a deep via 128 landing on the bottom gate structure GS1 without shorting with the top gate structure GS2. Stated differently, the deep via 128 non-overlaps with the top gate structure GS2 from a top view.

Figure 23:
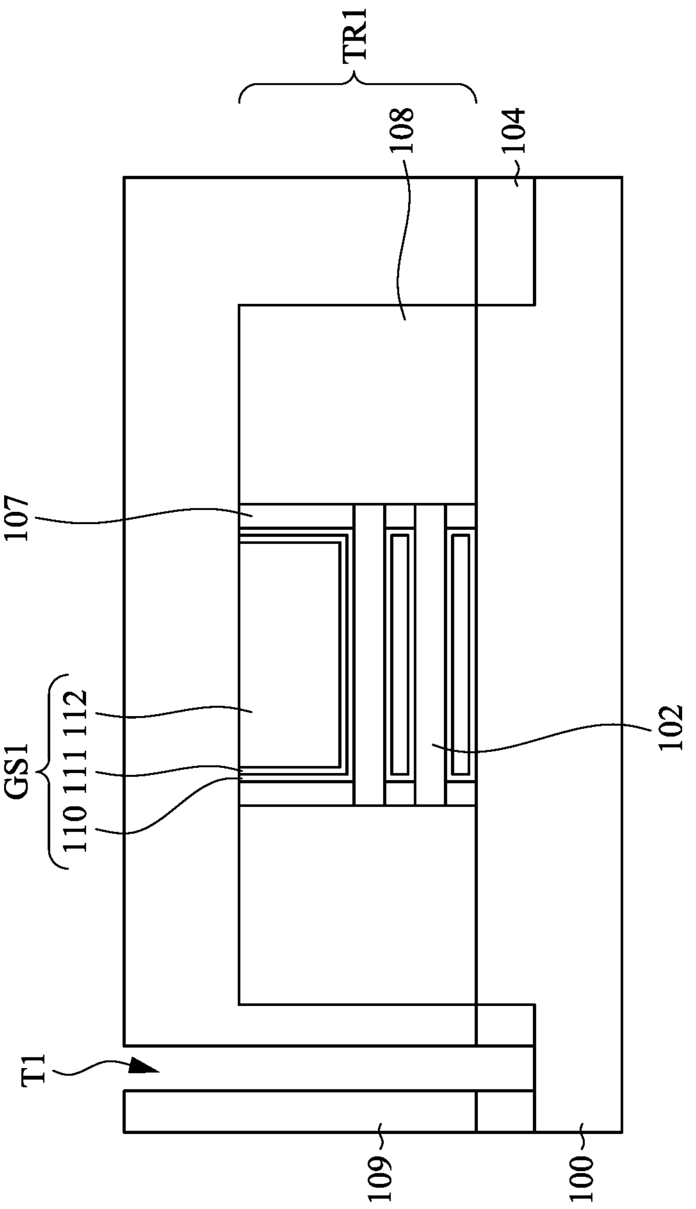
FIGS. 23-27 illustrate cross-sectional views of intermediate stages in forming a 3D IC structure in some embodiments.

FIGS. 23-27 illustrate cross-sectional views of intermediate stages in forming a 3D IC structure in some embodiments. The initial structure in FIG. 23 is similar to that shown in FIG. 9A, except that the structure in FIG. 23 has a single trench T1 on one side of the bottom GAA transistor. The reduction in trench number can prevent protrusions (e.g., protrusion 114P) formed on a crystalline silicon layer in a subsequent LLPE process.

Figure 24:
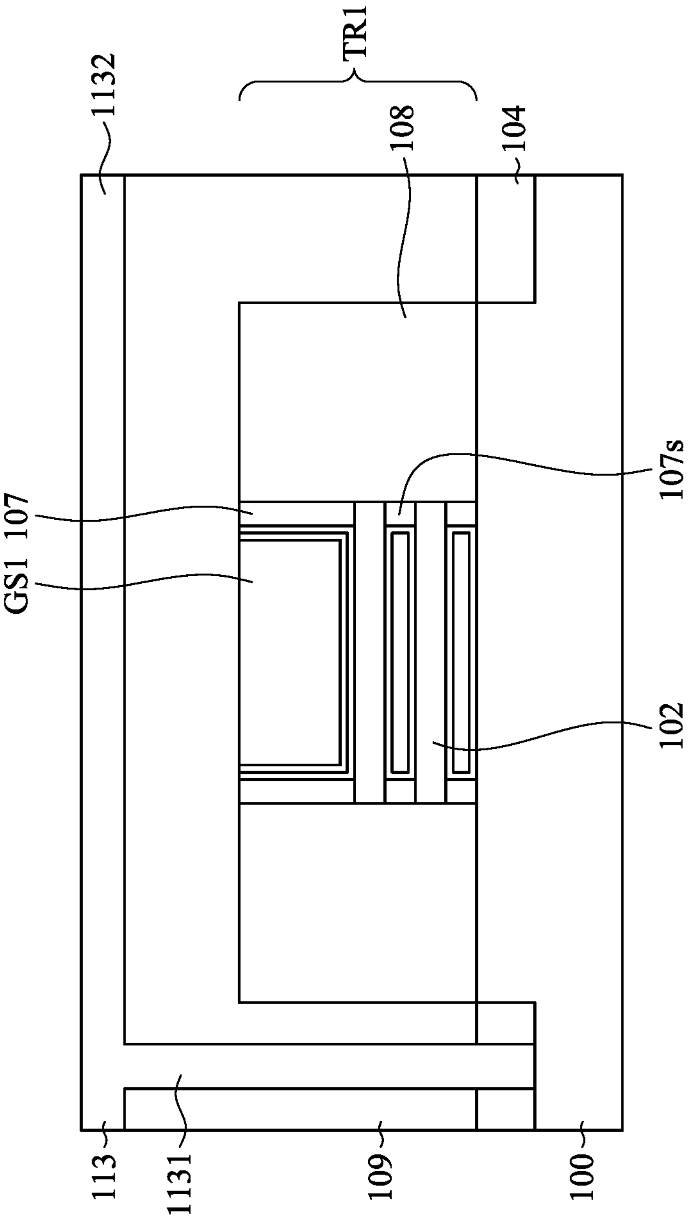

In FIG. 24, an amorphous silicon layer 113 is formed in the single trench T1 and over the ILD layer 109 by using suitable deposition methods. The amorphous silicon layer 113 has a single amorphous silicon plug 1131 extending in the single trench T1, and an amorphous silicon lateral portion 1132 extending along a top surface of the ILD layer 109. Other details about the amorphous silicon layer 113 are discussed previously with respect to FIG. 10 and thus not repeated for the sake of brevity.

Figure 25:
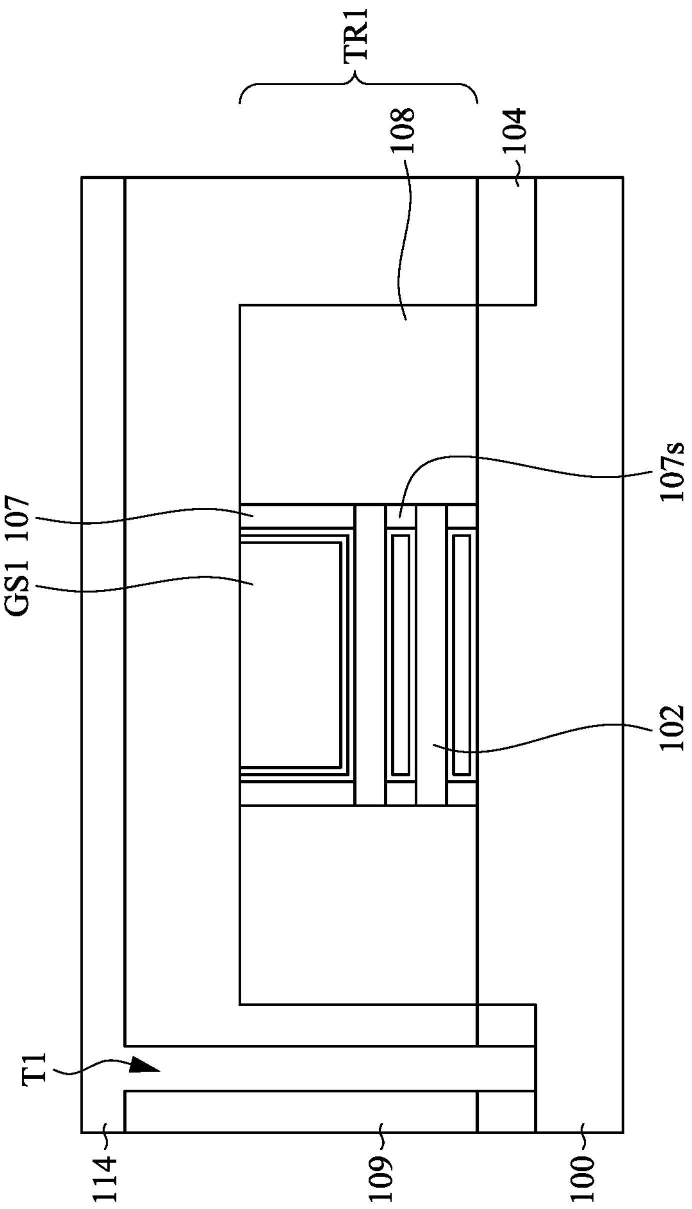

In FIG. 25, a crystallization process is performed convert the amorphous silicon layer 113 into a crystalline silicon layer 114 by using, for example, an LLPE process. Because the amorphous silicon layer 113 includes only a single plug in the trench T1, the crystalline silicon layer 114 can have no or negligible protrusion (such as the protrusion 114P as illustrated in FIG. 11) after the molten amorphous silicon is crystallized into a solid phase. Other details about the crystallization process are discussed previously with respect to FIG. 11 and thus not repeated for the sake of brevity.

Figure 26:
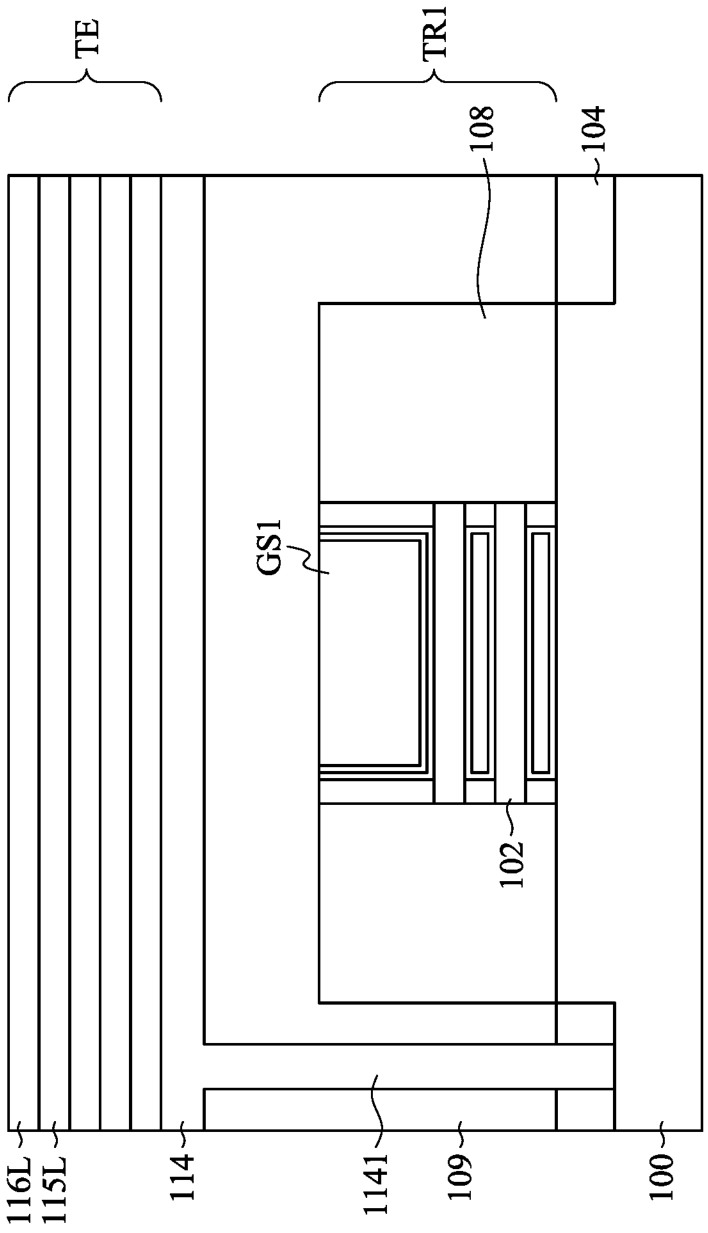

In FIG. 26, a top epitaxial stack TE is formed over the crystalline silicon layer 114. Details about the crystallization process are discussed previously with respect to FIG. 13 and thus not repeated for the sake of brevity.

Figure 27:
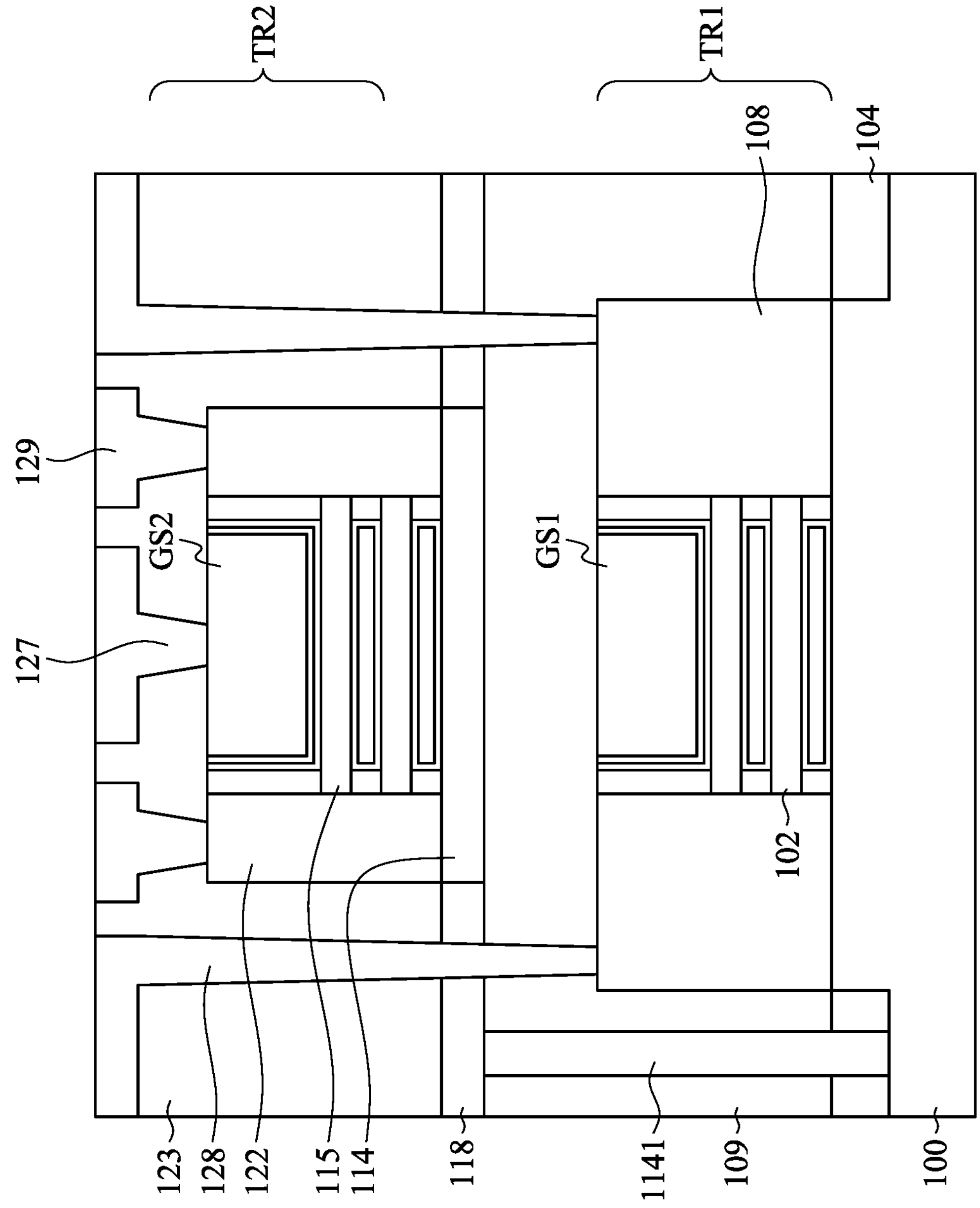

In FIG. 27, a top GAA-FET that includes nanostructures 115, source/drain regions 122 on opposite sides of the nanostructures 115, and a gate structure GS2 surrounding each of the nanostructures 115, is formed over the crystalline silicon layer 114. The top GAA-FET can be formed using the steps as illustrated in FIGS. 14-22B, and thus details about the manufacturing steps are not repeated for the sake of brevity.

Figure 28:
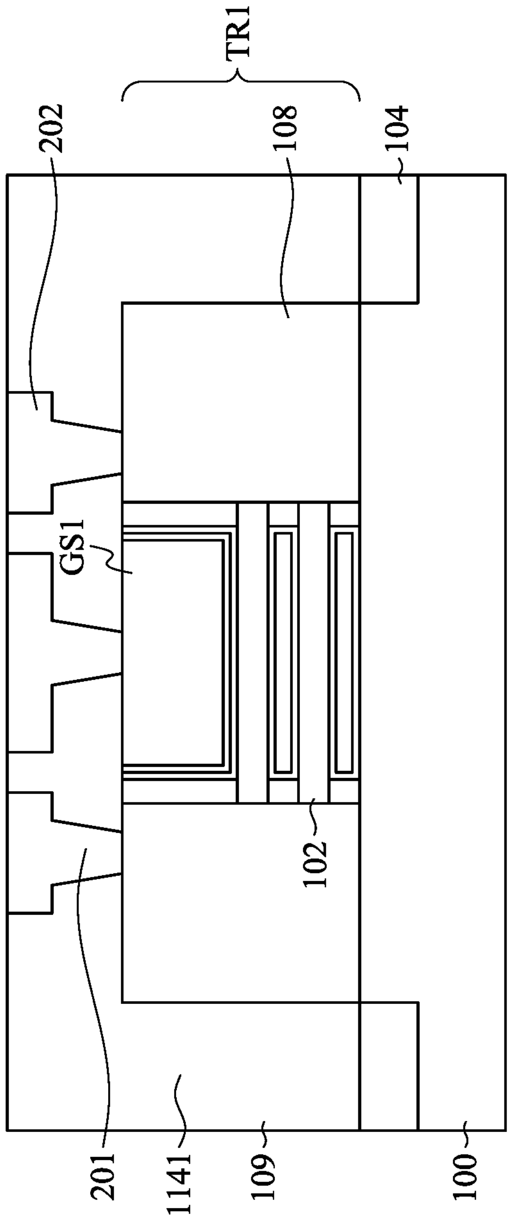
FIGS. 28-35 illustrate cross-sectional views of intermediate stages in forming a 3D IC structure in some embodiments.

FIGS. 28-35 illustrates cross-sectional views of intermediate stages in forming a 3D IC structure in some embodiments. The initial structure in FIG. 28 is similar to that shown in FIG. 8A, except that the structure in FIG. 28 includes bottom vias 201 and bottom metal lines 202 extending in the ILD layer 109 and the refill dielectric over the gate structure GS1. In particular, before forming a top GAA transistor over the bottom GAA transistor, BEOL processing can be performed to form bottom vias 201 and bottom metal lines 202 by using, for example, a dual damascene process. The vias 201 serve to couple source/drain regions 108 and the gate structure GS1 to the metal lines 202.

Figure 29:
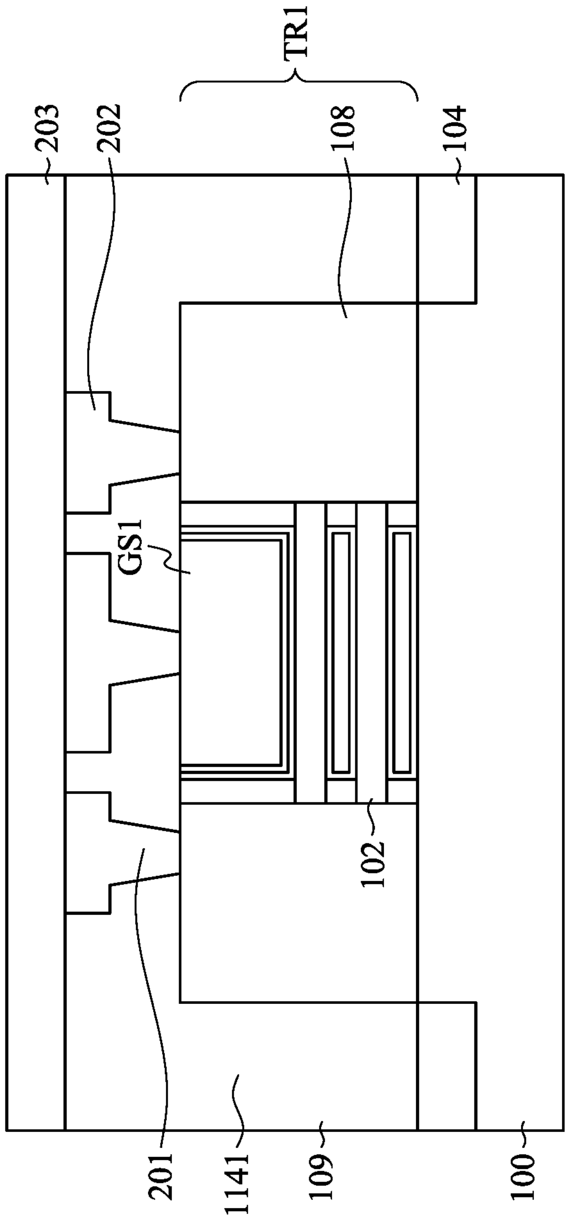

In FIG. 29, a dielectric layer 203 is formed over the ILD layer 109 and the metal lines 202. In some embodiments, the dielectric layer 203 may be deposited by any suitable method, such as CVD, plasma-enhanced CVD (PECVD), or FCVD. Dielectric material(s) of the dielectric layer 203 may include phospho-silicate glass (PSG), boro-silicate glass (BSG), boron-doped phospho-silicate glass (BPSG), undoped silicate glass (USG), or the like. Other insulation materials formed by any acceptable process may be used.

Figure 30:
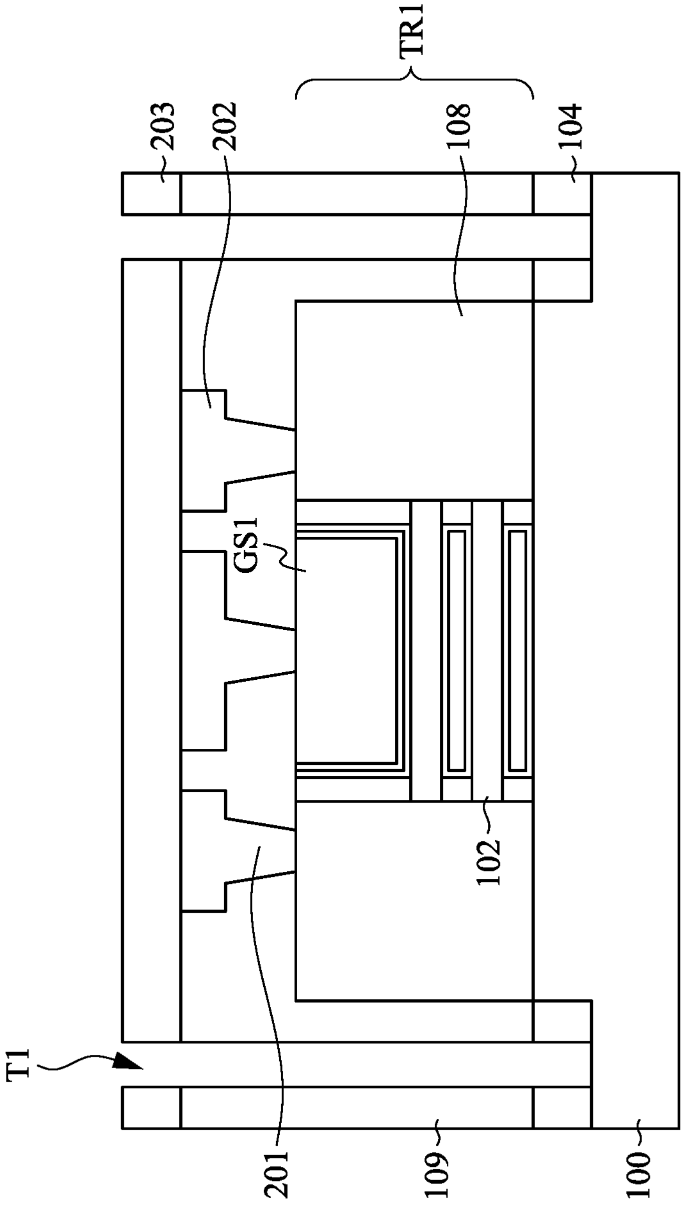

In FIG. 30, a patterning process is performed on the dielectric layer 203, the ILD layer 109 and the STI regions 104 to form one or more trences T1 in the dielectric layer 203, the ILD layer 109 and the STI regions 104, until the substrate 100 gets exposed at bottoms of the trenches T1. The trences T1 thus extends through a full thickness of the dielectric layer 203, a full thickness of the ILD layer 109 and a full thickness of the STI regions 104 to reach the substrate 100.

Figure 31:
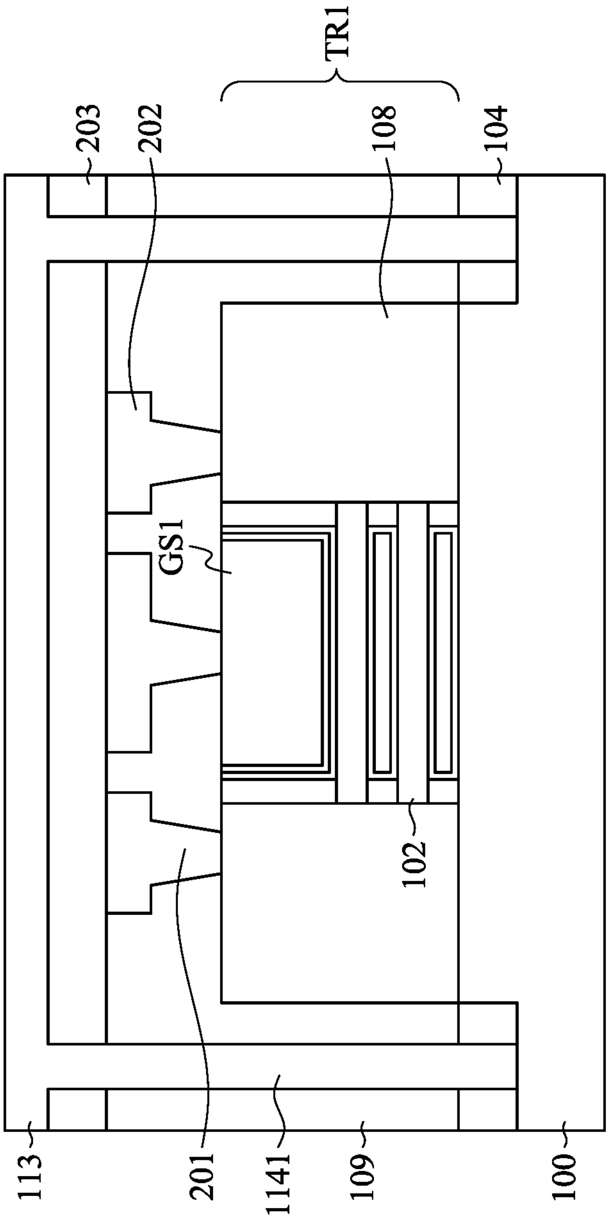

In FIG. 31, an amorphous silicon layer (i.e., amorphous semiconductor layer) 113 is formed over the dielectric layer 203 using CVD, ALD, the like, or other suitable processes. Other details about the amorphous silicon layer 113 are discussed previously with respect to FIG. 10 and thus not repeated for the sake of brevity.

Figure 32:
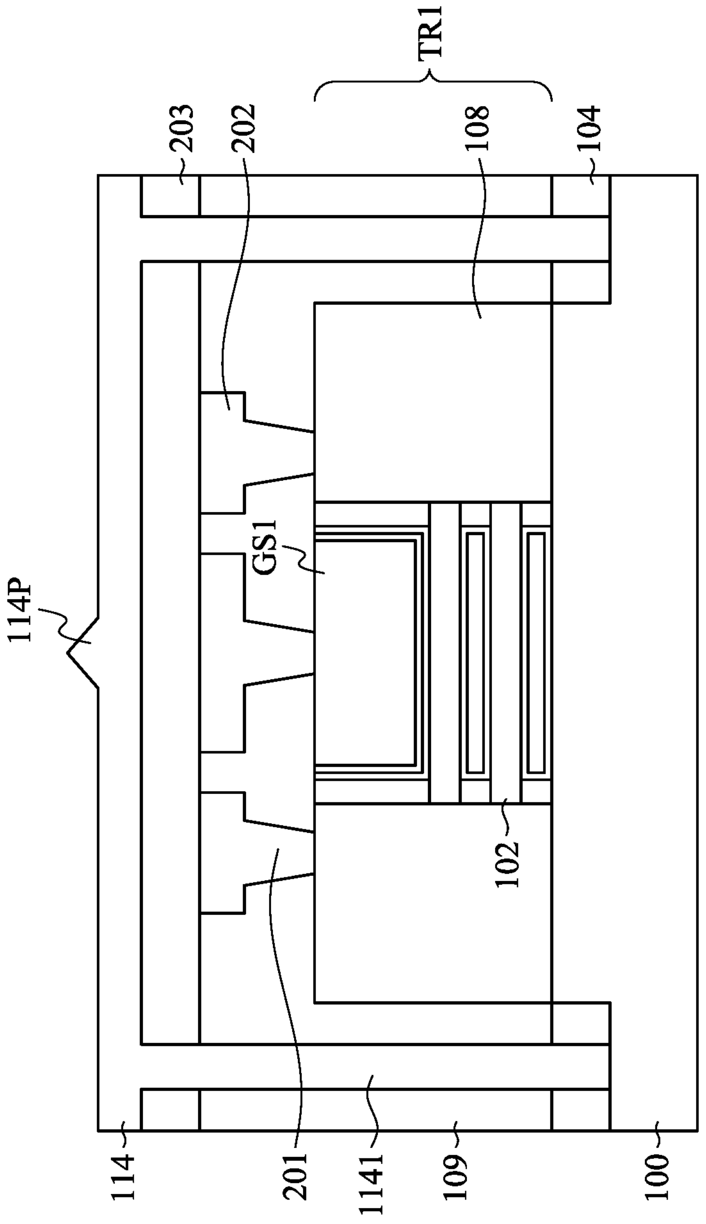

In FIG. 32, a crystallization process is performed to convert the amorphous silicon layer 113 into a crystalline silicon layer 114. Other details about the crystalline silicon layer 114 are discussed previously with respect to FIG. 11 and thus not repeated for the sake of brevity.

Figure 33:
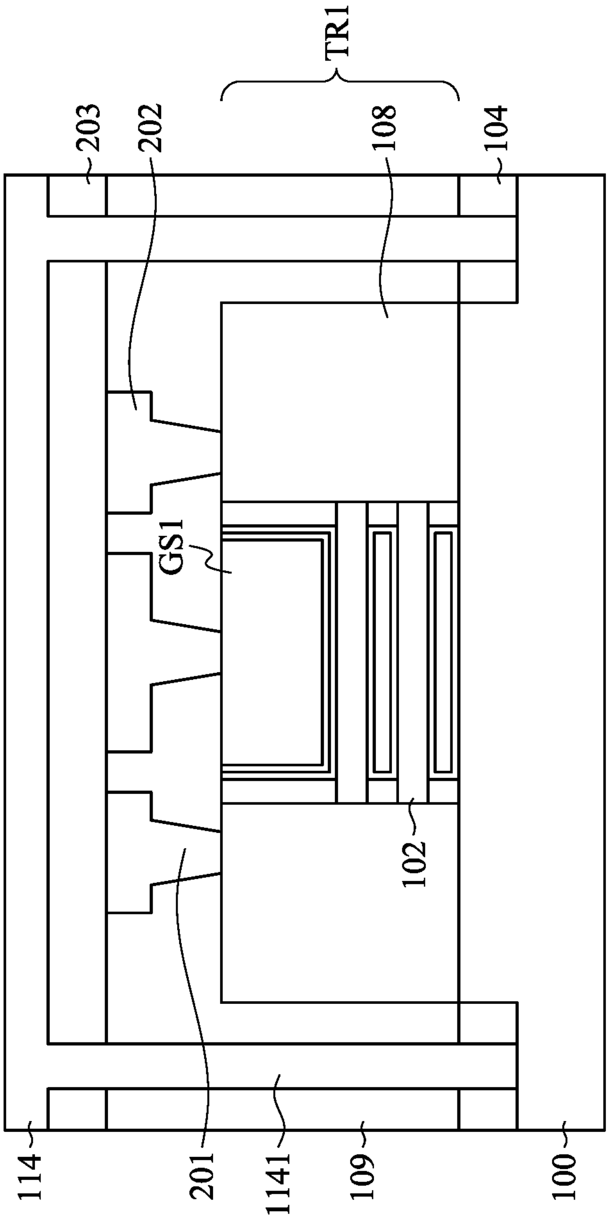

In FIG. 33, a CMP process is performed on the crystalline silicon layer 114 to remove the protrusions 114P.

Figure 34:
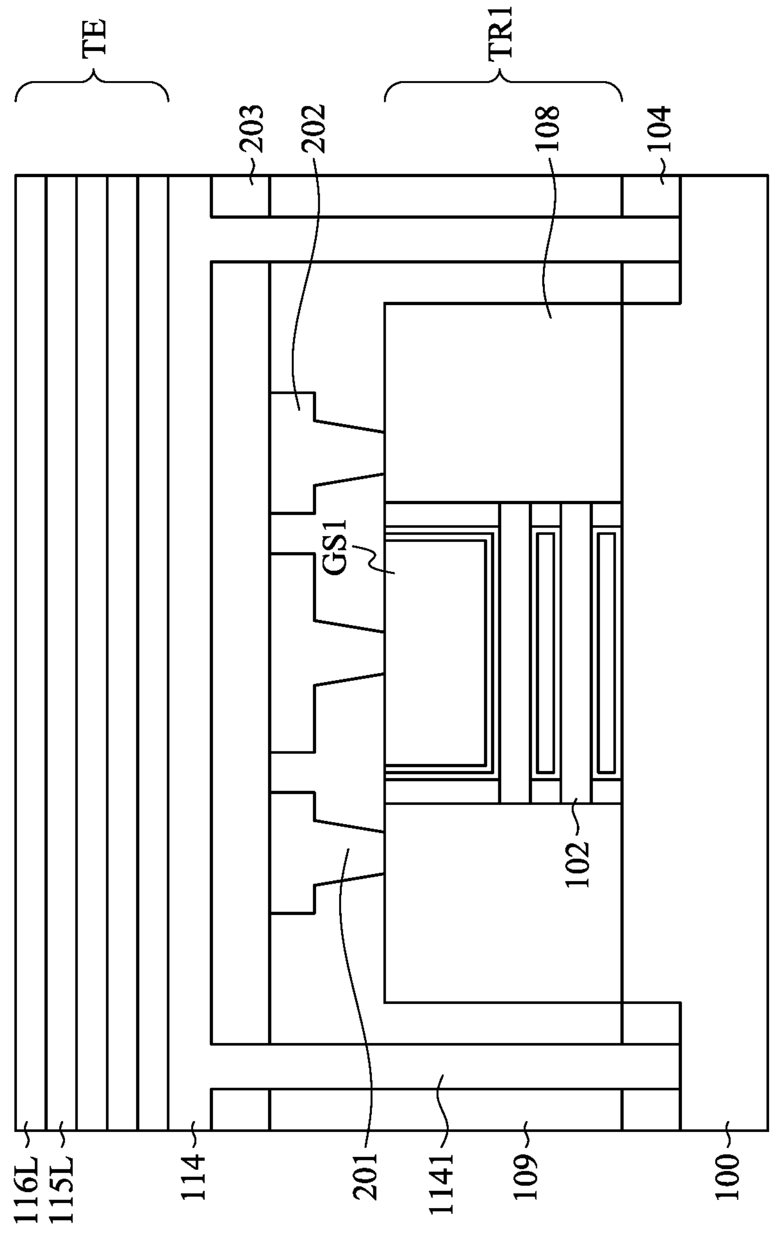

In. FIG. 34, a top epitaxial stack TE is formed over the crystalline silicon layer 114. Details about the top epitaxial stack TE are discussed previously with respect to FIG. 13 and thus not repeated for the sake of brevity.

Figure 35:
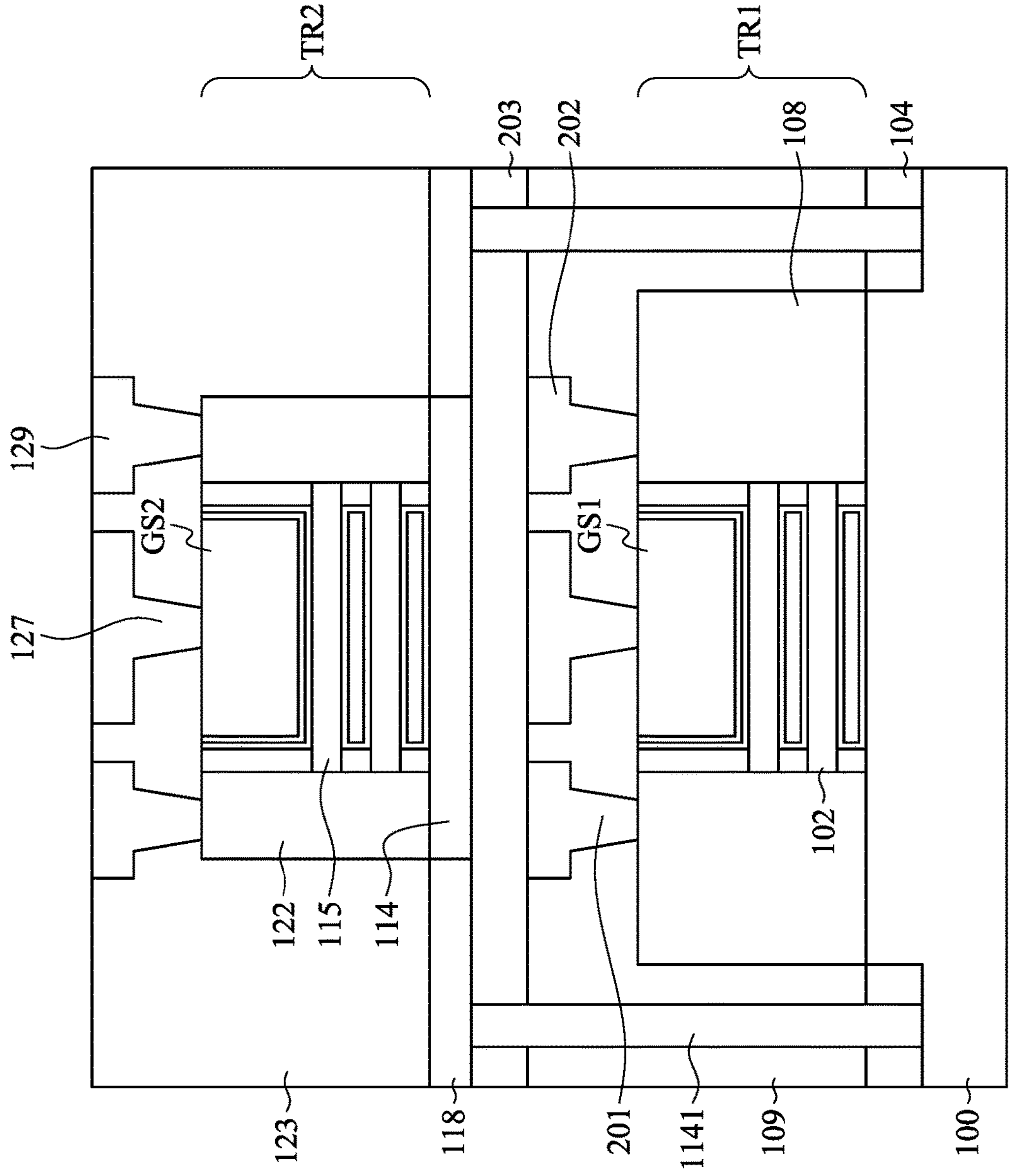

In FIG. 35, a top GAA-FET that includes nanostructures 115, source/drain regions 122 on opposite sides of the nanostructures 115, and a gate structure GS2 surrounding each of the nanostructures 115, is formed over the crystalline silicon layer 114. The top GAA-FET can be formed using the steps as illustrated in FIGS. 14-22B, and thus details about the manufacturing steps are not repeated for the sake of brevity. The deep vias 128 as illustrated in FIG. 22A can be omitted because the routing of bottom GAA transistors can be implemented using the bottom vias 201 and bottom metal lines 202.

Figure 36:
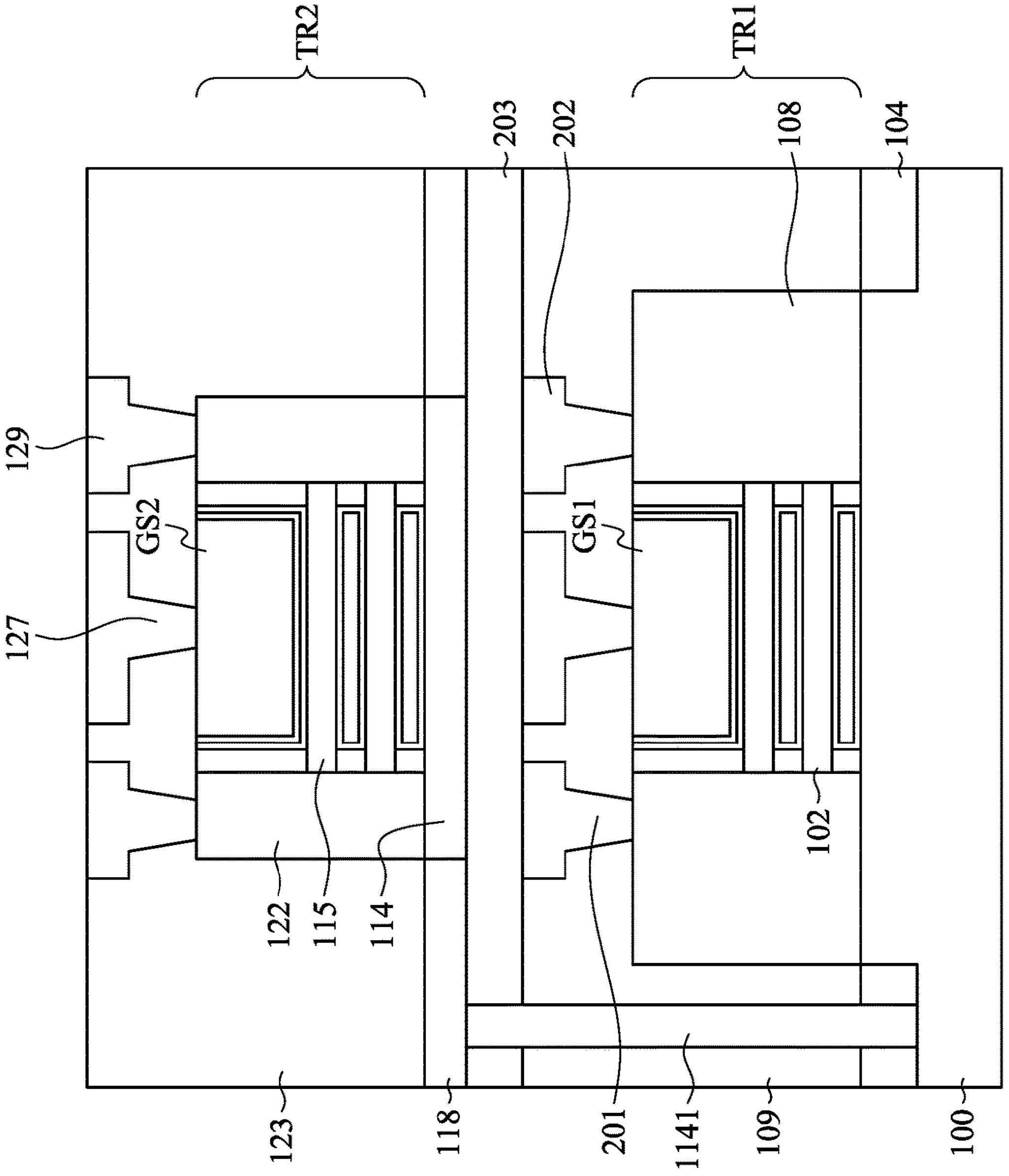
FIG. 36 illustrates a cross-sectional view of a 3D IC structure in some embodiments.

FIG. 36 illustrates a cross-sectional view of a 3D IC structure in some embodiments. The 3D IC structure is similar to that shown in FIG. 35, except that the structure in FIG. 35 includes only a crystalline silicon plug 1141 in a single trench extending through the dielectric layer 203, the ILD layer 109, and the STI region 104.

Figure 37:
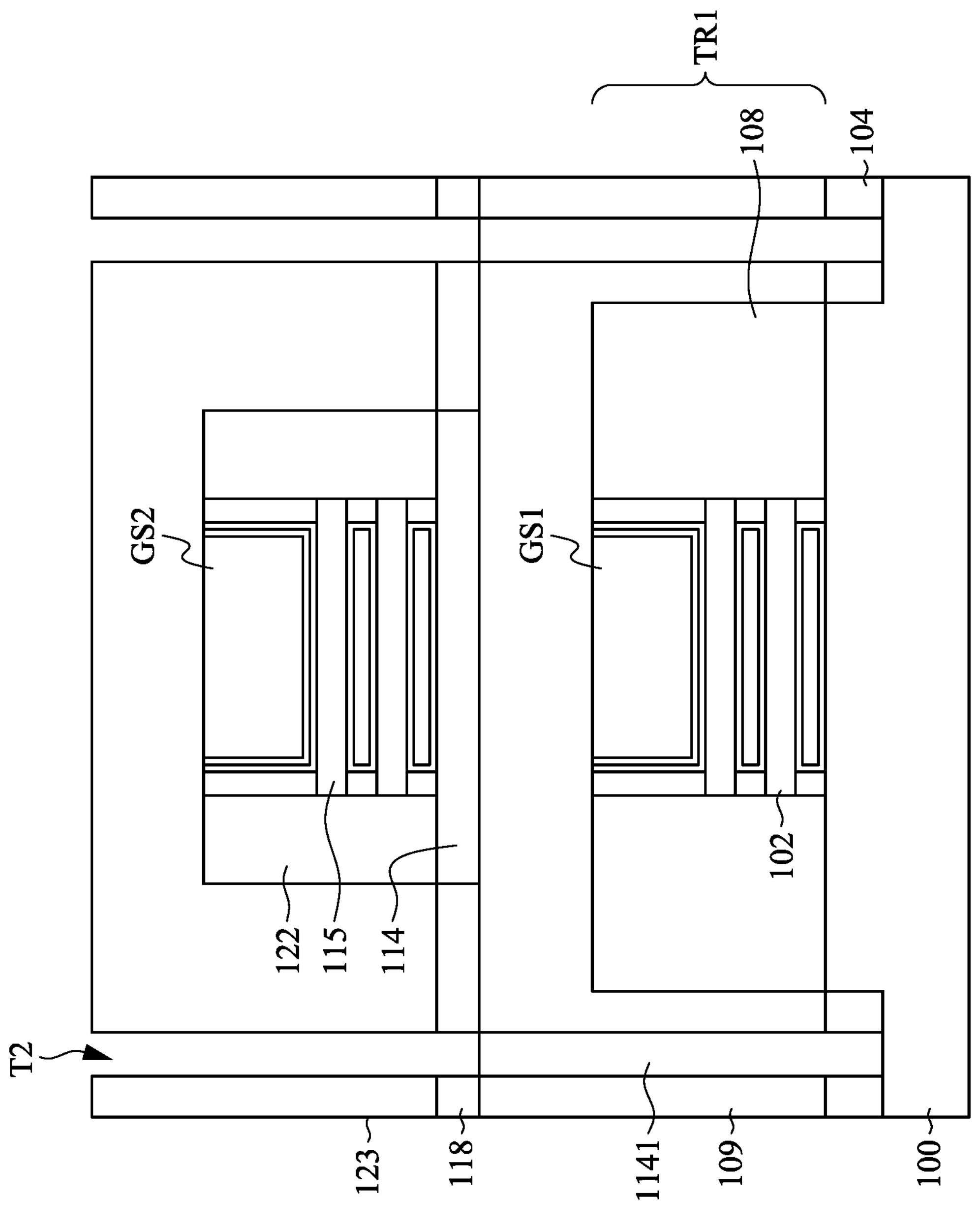
FIGS. 37-42 illustrate cross-sectional views of intermediate stages in forming a 3D IC structure in some embodiments.

FIGS. 37-42 illustrate cross-sectional views of intermediate stages in forming a 3D IC structure in some embodiments. The initial structure in FIG. 37 is subsequent to the step as illustrated in FIGS. 21A-21B. In some embodiments, after the top gate structure GS2 is formed, a patterning process is performed on the ILD layer 123 to form one or more trenches T2 in the ILD layer 123, until the crystalline silicon plugs 1141 get exposed at bottoms of the trenches T2. The trenches T2 thus extend through a full thickness of the ILD layer 123 and a full thickness of the STI regions 118 to reach the crystalline silicon plugs 1141.

Figure 38:
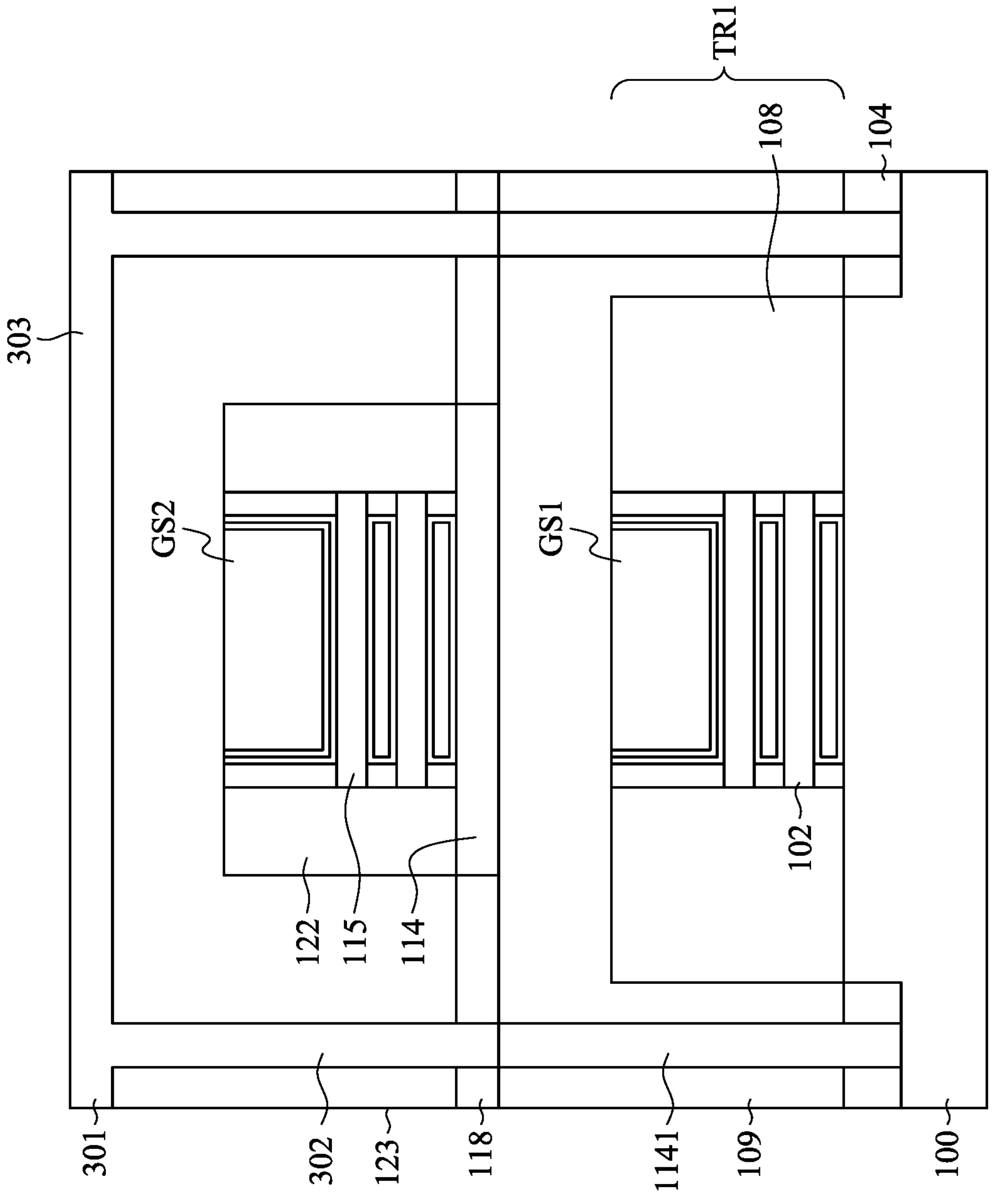

In FIG. 38, an amorphous silicon layer (i.e., amorphous semiconductor layer) 301 is formed over the ILD layer 123 using CVD, ALD, the like, or other suitable processes. The amorphous silicon layer 301 includes amorphous silicon plugs 302 extending in the trenches T2 in the ILD layer 123, and an amorphous silicon lateral portion 303 extending along a top surface of the ILD layer 123. Other details about the amorphous silicon layer are discussed previously with respect to FIG. 10 and thus not repeated for the sake of brevity.

Figure 39:
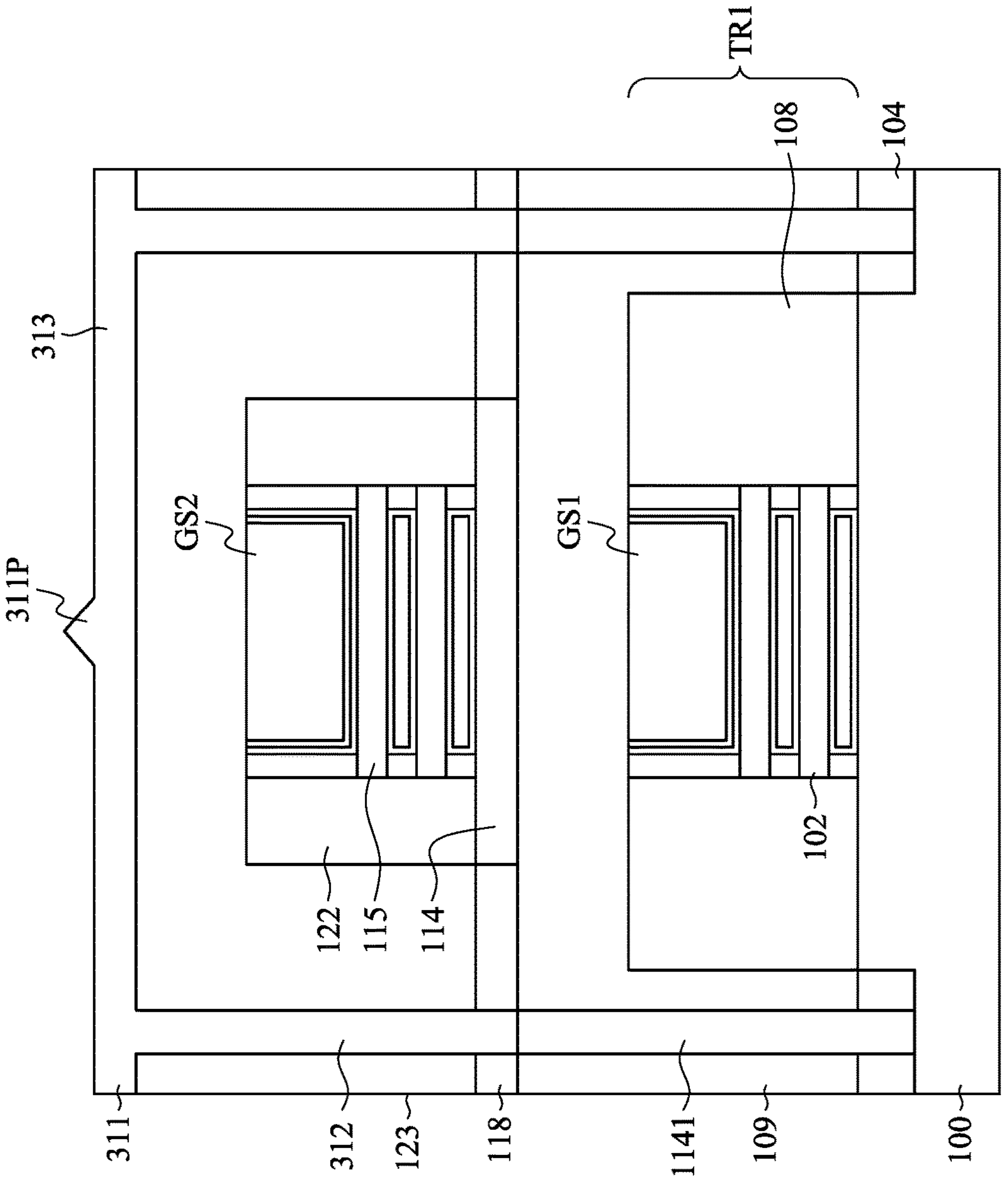

In FIG. 39, a crystallization process is performed to convert the amorphous silicon layer 301 into a crystalline silicon layer 311. The crystalline silicon layer 311 includes crystalline silicon plugs 312 extending in the trenches T2 in the ILD layer 123, and a crystalline silicon lateral portion 313 extending along a top surface of the ILD layer 123. Other details about the crystalline silicon layer 311 are discussed previously with respect to FIG. 11 and thus not repeated for the sake of brevity.

Figure 40:
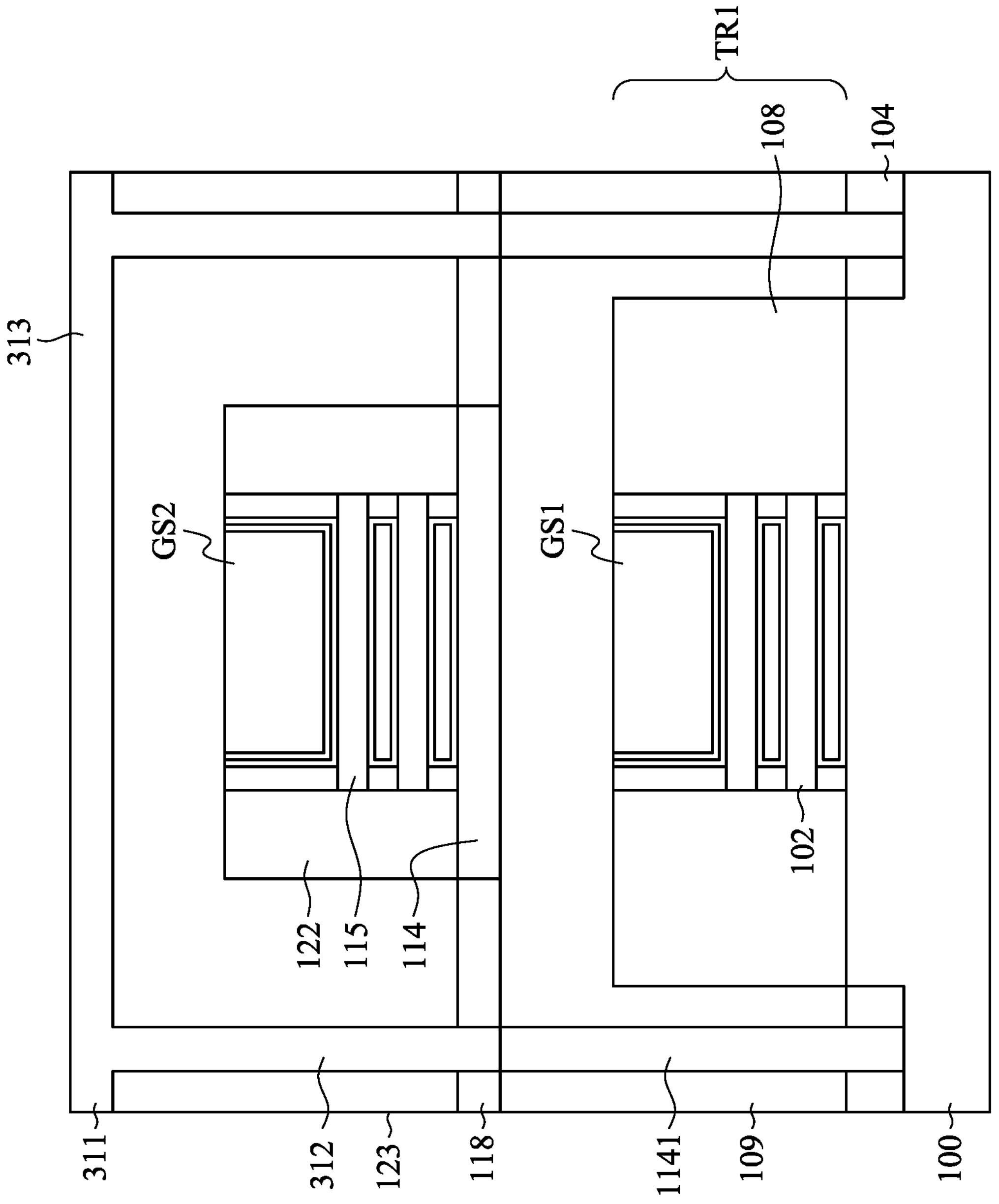

In FIG. 40, a CMP process is performed on the crystalline silicon layer 311 to remove the protrusions 311P.

Figure 41:
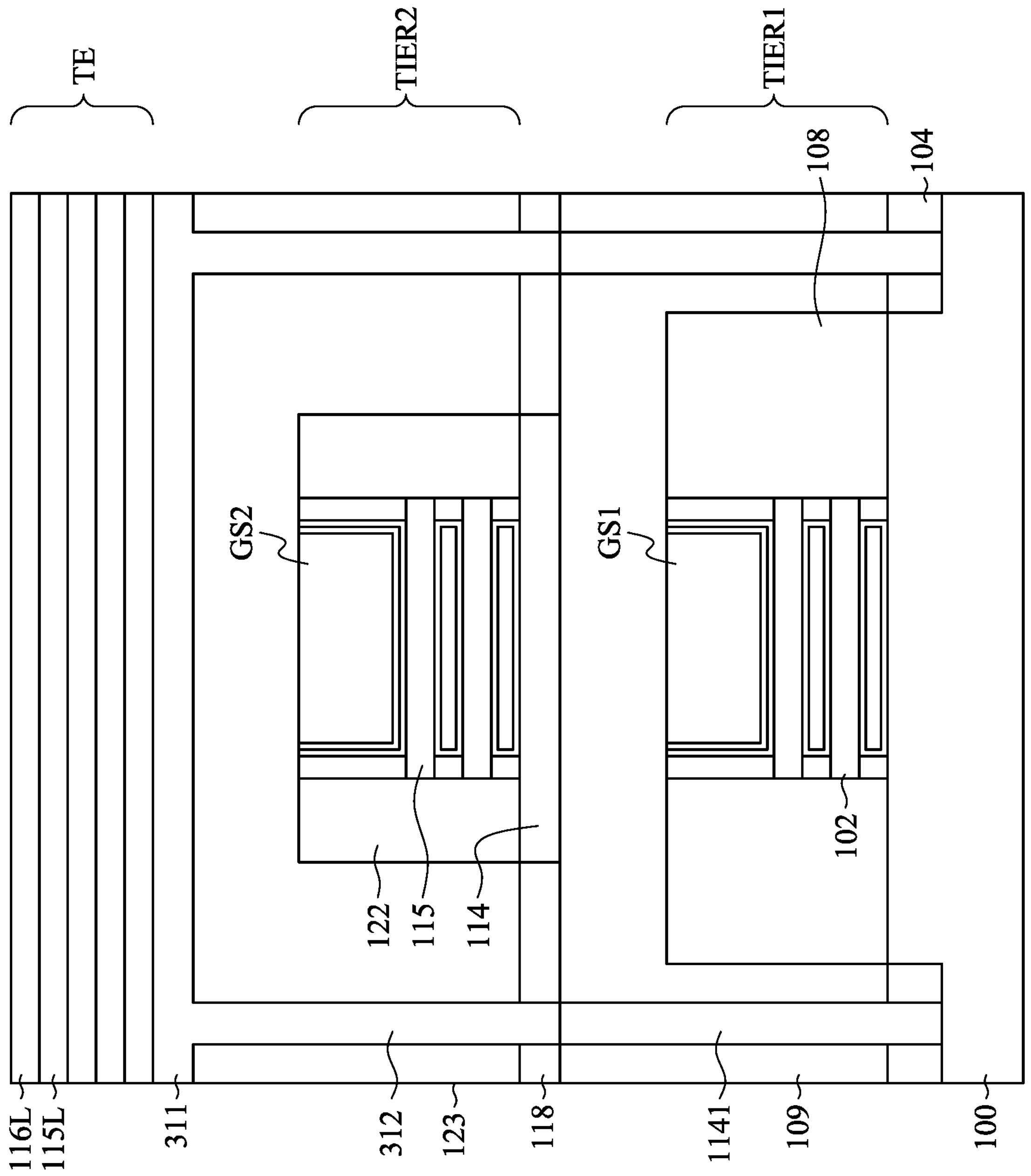

In. FIG. 41, a top epitaxial stack TE is formed over the crystalline silicon layer 311. Details about the top epitaxial stack TE are discussed previously with respect to FIG. 13 and thus not repeated for the sake of brevity.

Figure 42:
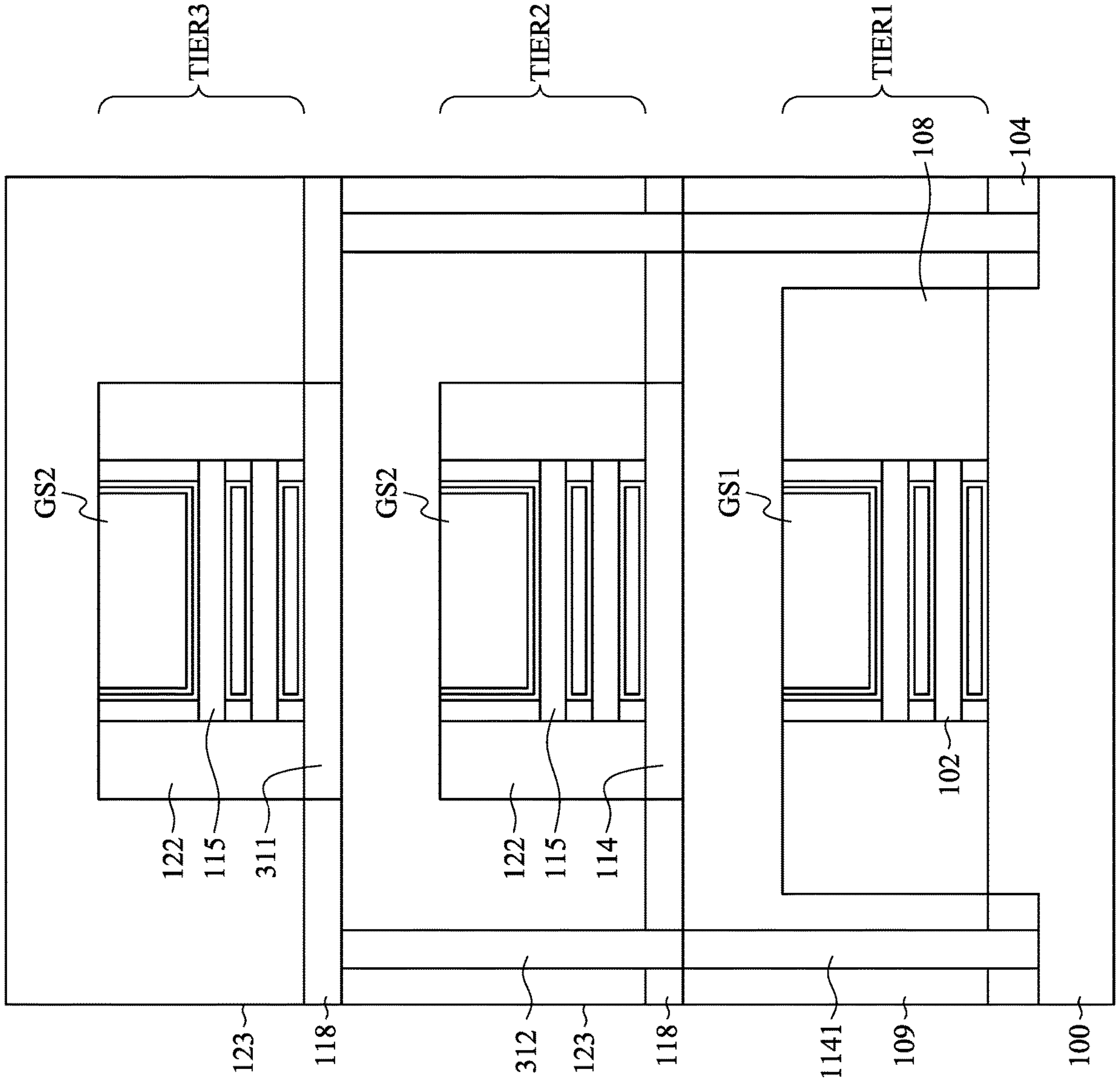

In FIG. 42, a top GAA-FET that includes nanostructures 115, source/drain regions 122 on opposite sides of the nanostructures 115, and a gate structure GS2 surrounding each of the nanostructures 115, is formed over the crystalline silicon layer 311. The top GAA-FET can be formed using the steps as illustrated in FIGS. 14-22B, and thus details about the manufacturing steps are not repeated for the sake of brevity. As illustrated in FIG. 41, the resulting 3D IC structure includes three tiers of transistors each located at different elevations (i.e., different level height), which are labeled "TIER1," "TIER2," and "TIER3" in FIG. 41. However, in some other embodiments, the 3D IC structure may include more or less tiers of transistors. For example, the number of tiers may range from 1 to 101.

In the foregoing embodiments, the 3D IC structure includes GAA transistors at different level heights. However, in some other embodiments, planar transistors, FinFETs, or fork-sheet transistors can also be used for the 3D IC structure. Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the 3D IC structure comprising bottom-tier transistors and top-tier transistors can be formed without wafer bonding. Another advantage is that the 3D IC structure utilizes a laser-liquid-phase-epitaxy technique to create an epitaxial layer above the bottom-tier transistors, which can function as a seed layer, enabling the growth of an epitaxial stack for fabricating top-tier transistors on an elevated level.

In some embodiments, a method includes forming a first transistor on a substrate, forming a first dielectric layer over the first transistor, forming a first trench in the first dielectric layer, depositing an amorphous semiconductor layer in the first trench and over the first dielectric layer, crystallizing the amorphous semiconductor layer into a crystalline semiconductor layer, and forming a second transistor over the crystalline semiconductor layer. A bottom of the first trench is at the substrate. In some embodiments, a second trench is formed in the first dielectric layer. A bottom of the second trench is at the substrate. The first transistor is laterally between the first trench and the second trench. In some embodiments, the amorphous semiconductor layer is further deposited in the second trench. In some embodiments, a chemical mechanical polish (CMP) process is performed to remove a protrusion from the crystalline semiconductor layer. In some embodiments, the second transistor has a channel material different from a channel material of the first transistor. In some embodiments, the first transistor and the second transistor are of different conductivity types. In some embodiments, the amorphous semiconductor layer is crystallized into the crystalline semiconductor layer by using a laser anneal. In some embodiments, the laser anneal is performed such that the amorphous semiconductor layer is turned into a liquid phase. In some embodiments, forming the second transistor includes forming an epitaxial stack on the crystalline semiconductor layer, the epitaxial stack comprising first semiconductor layers and second semiconductor layers alternating with the first semiconductor layers; forming a dummy gate structure over the epitaxial stack; forming gate spacers on opposite sides of the dummy gate structure; etching portions of the epitaxial stack that are not covered by the dummy gate structure and the gate spacers; after etching the portions of the epitaxial stack, forming epitaxial source/drain regions on the crystalline semiconductor layer; removing the dummy gate structure and the first semiconductor layers; and forming a gate structure surrounding the semiconductor layers. In some embodiments, the method further includes forming a second dielectric layer over the second transistor, forming a first via extending in the second dielectric layer to the second transistor, and forming a second via extending in the first dielectric layer and the second dielectric layer to the first transistor. In some embodiments, the method further includes forming metal vias and metal lines in the first dielectric layer prior to forming the first trench in the first dielectric layer.

In some embodiments, a method includes forming a first transistor on a substrate, forming a dielectric layer over the substrate; etching a first trench in the dielectric layer until the substrate is exposed in the first trench; forming an amorphous semiconductor material in the first trench and over the dielectric layer; performing an anneal process on the amorphous semiconductor material, the anneal process turning the amorphous semiconductor material into a crystalline semiconductor material; forming an epitaxial stack on the crystalline semiconductor material, the epitaxial stack comprising first semiconductor layers and second semiconductor layers alternating with the first semiconductor layers; and replacing the first semiconductor layers with a gate structure.

In some embodiments, an IC structure includes a first transistor, a second transistor, a first dielectric layer, a first crystalline semiconductor plug, a crystalline semiconductor lateral portion. The first transistor is over a substrate. The second transistor is at a different level height than the first transistor. The first dielectric layer interposes the first transistor and the second transistor. The first crystalline semiconductor plug extends through the first dielectric layer. The crystalline semiconductor lateral portion extends along a top surface of the first dielectric layer. The second transistor is formed over the crystalline semiconductor lateral portion, and the crystalline semiconductor lateral portion is formed of a same material as the first crystalline semiconductor plug. In some embodiments, the crystalline semiconductor plug is spaced apart from the crystalline semiconductor lateral portion. In some embodiments, the crystalline semiconductor plug is in contact with the substrate. In some embodiments, the IC structure further includes a second crystalline semiconductor plug extending through the first dielectric layer. The first transistor is laterally between the first crystalline semiconductor plug and the second crystalline semiconductor plug. In some embodiments, the IC structure further includes a second dielectric layer over the second transistor, and metal vias in the second dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a first transistor on a substrate;

forming a first dielectric layer over the first transistor;

forming a first trench and a second trench in the first dielectric layer, wherein a bottom of the first trench and a bottom of the second trench are at the substrate, wherein the first transistor is laterally between the first trench and the second trench;

depositing an amorphous semiconductor layer in the first trench and over the first dielectric layer, wherein the amorphous semiconductor layer is further deposited in the second trench;

crystallizing the amorphous semiconductor layer into a crystalline semiconductor layer; and forming a second transistor over the crystalline semiconductor layer.

2. The method of claim 1, further comprising:

performing a chemical mechanical polish (CMP) process to remove a protrusion from the crystalline semiconductor layer.

3. The method of claim 1, wherein the second transistor has a channel material different from a channel material of the first transistor.

4. The method of claim 1, wherein the first transistor and the second transistor are of different conductivity types.

5. The method of claim 1, wherein the amorphous semiconductor layer is crystallized into the crystalline semiconductor layer by using a laser anneal.

6. The method of claim 5, wherein the laser anneal is performed such that the amorphous semiconductor layer is turned into a liquid phase.

7. The method of claim 1, wherein forming the second transistor comprises:

forming an epitaxial stack on the crystalline semiconductor layer, the epitaxial stack comprising first semiconductor layers and second semiconductor layers alternating with the first semiconductor layers;

forming a dummy gate structure over the epitaxial stack;

forming gate spacers on opposite sides of the dummy gate structure;

etching portions of the epitaxial stack that are not covered by the dummy gate structure and the gate spacers;

after etching the portions of the epitaxial stack, forming epitaxial source/drain regions on the crystalline semiconductor layer;

removing the dummy gate structure and the first semiconductor layers; and forming a gate structure surrounding the second semiconductor layers.

8. The method of claim 1, further comprising:

forming a second dielectric layer over the second transistor;

forming a first via extending in the second dielectric layer to the second transistor; and forming a second via extending in the first dielectric layer and the second dielectric layer to the first transistor.

9. The method of claim 1, wherein the amorphous semiconductor layer is an amorphous silicon layer.

10. A method comprising:

forming a first transistor on a substrate;

forming a dielectric layer over the substrate;

etching a first trench in the dielectric layer until the substrate is exposed in the first trench;

forming an amorphous semiconductor material in the first trench and over the dielectric layer;

performing an anneal process on the amorphous semiconductor material, the anneal process turning the amorphous semiconductor material into a crystalline semiconductor material;

forming an epitaxial stack on the crystalline semiconductor material, the epitaxial stack comprising first semiconductor layers and second semiconductor layers alternating with the first semiconductor layers; and replacing the first semiconductor layers with a gate structure.

11. The method of claim 10, wherein the anneal process is a laser anneal.

12. The method of claim 11, wherein the anneal process is performed such that the amorphous semiconductor material is melt into a liquid phase.

13. The method of claim 10, further comprising:

planarizing the crystalline semiconductor material prior to forming the epitaxial stack.

14. The method of claim 10, further comprising:

etching a second trench in the dielectric layer until the substrate is exposed in the second trench, wherein the first transistor is laterally between the first trench and the second trench, and the amorphous semiconductor material is further formed in the second trench.

15. The method of claim 10, wherein the amorphous semiconductor material is amorphous silicon.

16. A method comprising:

forming a first transistor over a substrate;

forming a first dielectric layer over the first transistor;

forming a first crystalline semiconductor plug extending through the first dielectric layer;

forming a crystalline semiconductor lateral portion extending along a top surface of the first dielectric layer, wherein the crystalline semiconductor lateral portion is formed of a same material as the first crystalline semiconductor plug; and forming a second transistor over the crystalline semiconductor lateral portion, wherein the first crystalline semiconductor plug is spaced apart from the crystalline semiconductor lateral portion.

17. The method of claim 16, wherein the first crystalline semiconductor plug is in contact with the substrate.

18. The method of claim 16, further comprising:

forming a second crystalline semiconductor plug extending through the first dielectric layer, wherein the first transistor is laterally between the first crystalline semiconductor plug and the second crystalline semiconductor plug.

19. The method of claim 16, further comprising:

forming a second dielectric layer over the second transistor; and forming metal vias in the second dielectric layer.

20. The method of claim 16, wherein the first crystalline semiconductor plug is a crystalline silicon plug.

* * * * *